United States Patent [19]
Suda

[11] Patent Number: 5,889,681
[45] Date of Patent: Mar. 30, 1999

[54] METHOD OF GENERATING LAYOUT OF SEMICONDUCTOR INTEGRATED CIRCUIT

[75] Inventor: Motomu Suda, Tokyo, Japan

[73] Assignee: Kabushiki Kaisha Toshiba, Kawasaki, Japan

[21] Appl. No.: 739,831

[22] Filed: Oct. 30, 1996

[30] Foreign Application Priority Data

Oct. 31, 1995 [JP] Japan ................................. 7-283862

[51] Int. Cl.[6] .................................................. G06F 17/50
[52] U.S. Cl. .......................................... 364/491; 364/489
[58] Field of Search .................................. 364/488, 489, 364/490, 491

[56] References Cited

U.S. PATENT DOCUMENTS

| | | | |
|---|---|---|---|
| 5,079,717 | 1/1992 | Miwa ............................................. | 364/490 |
| 5,097,422 | 3/1992 | Corbin, II et al. ........................... | 364/491 |
| 5,119,313 | 6/1992 | Shaw et al. .................................. | 364/491 |
| 5,267,177 | 11/1993 | Sato et al. ................................... | 364/491 |
| 5,281,558 | 1/1994 | Bamji et al. ................................. | 437/250 |
| 5,381,343 | 1/1995 | Bamji et al. ................................. | 364/488 |
| 5,416,722 | 5/1995 | Edwards ...................................... | 364/491 |
| 5,461,577 | 10/1995 | Shaw et al. .................................. | 364/491 |
| 5,465,218 | 11/1995 | Handa .......................................... | 364/489 |
| 5,612,893 | 3/1997 | Hao et al. .................................... | 364/491 |
| 5,636,132 | 6/1997 | Kamdar ........................................ | 364/491 |
| 5,663,892 | 9/1997 | Hayashi et al. .............................. | 364/491 |

*Primary Examiner*—Kevin J. Teska
*Assistant Examiner*—Leigh Marie Garbowski
*Attorney, Agent, or Firm*—Foley & Lardner

[57] ABSTRACT

A method of generating a hierarchical layout of cells of a semiconductor integrated circuit includes the steps of arranging an abstract cell in a target cell, setting the positions of second terminals in the abstract cell as compaction constraints on first terminals of the target cell, forming jogged lines, moving the first terminals having the compaction constraints to intersections between the jogged lines and an edge of the abstract cell, and compacting the target cell.

12 Claims, 29 Drawing Sheets

FIG.22A    FIG.22B    FIG.22C
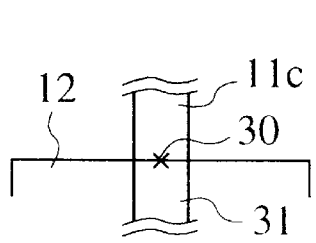
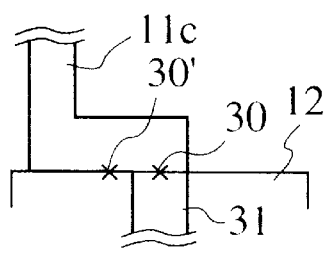
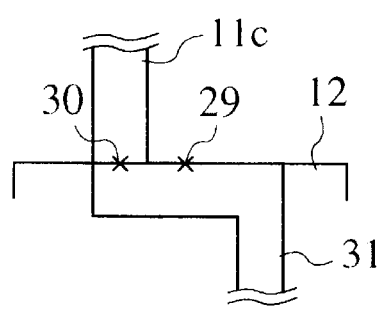
FIG.23
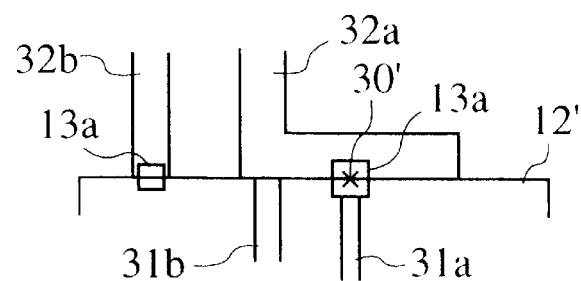

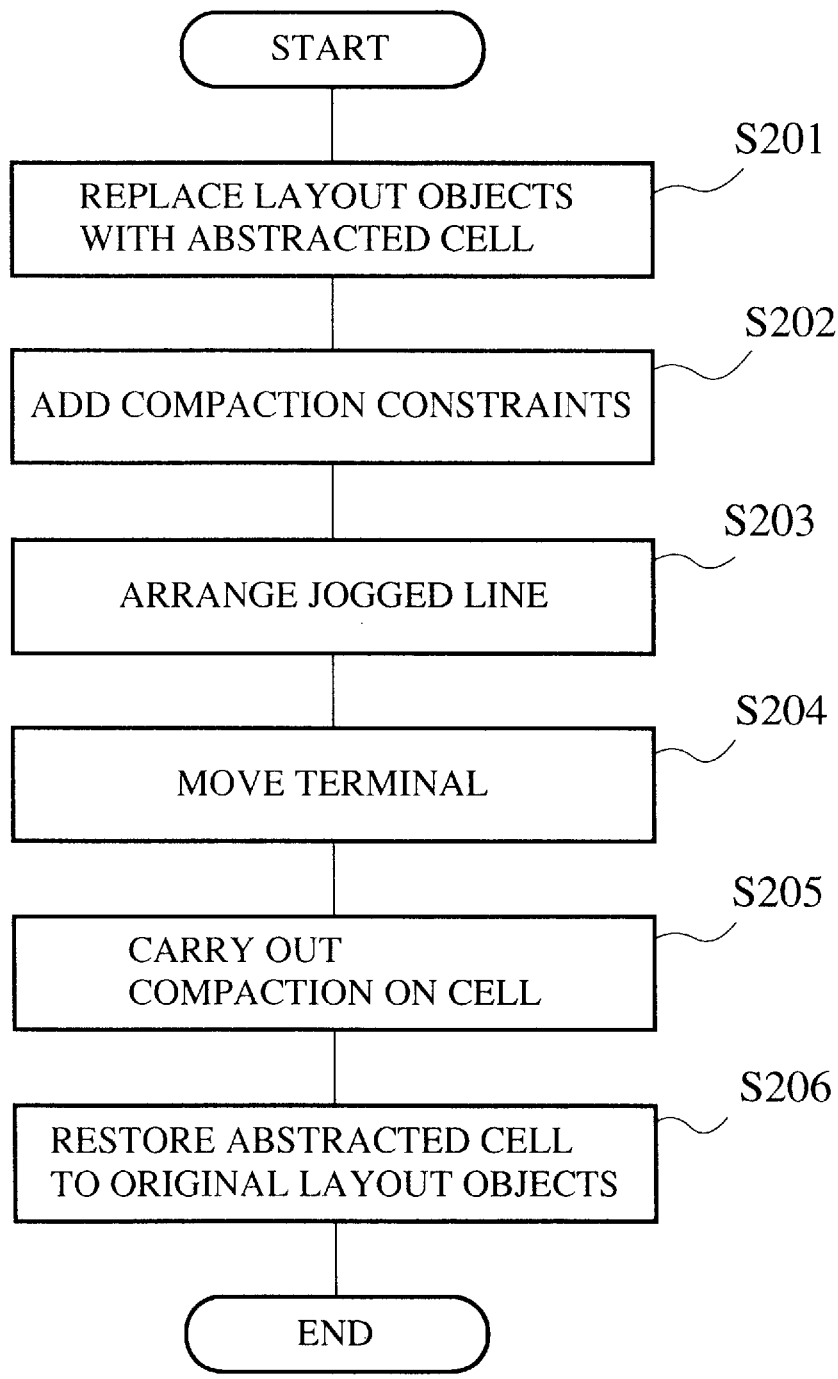

METHOD OF GENERATING LAYOUT OF SEMICONDUCTOR INTEGRATED CIRCUIT

BACKGROUND OF THE INVENTION

1. Field of the Invention

The present invention relates to a method of generating a layout of a semiconductor integrated circuit by compacting hierarchical cells of the circuit and by connecting terminals of the cells to one another without wiring breaks.

2. Description of the Prior Art

A semiconductor integrated circuit has many terminals that are connected to one another according to routing techniques. Well-known routing techniques are channel routing, maze routing, line search routing, and river routing. These are explained in, for example, "Algorithms for VLSI Physical Design Automation," Naveed A. Sherwani, Kluwer Academic Publishers, 1993.

The channel routing minimizes the width of a channel sandwiched between two cell arrays, to minimize the number of tracks in a horizontal direction. The maze routing divides a chip into a lattice and generates routes on the lattice. The line search routing extends horizontal and vertical segments from start and end points and finds routs according to the segments. The river routing will be explained later.

An example of a technique for compacting a hierarchical layout of a semiconductor integrated circuit is a flat compaction. This technique develops the hierarchy into a flat form and compacts the flat form. The technique has a limit in a processible circuit scale because the processing capacity of an EWS serving as a compactor is limited to about 10,000 transistors. To solve this problem, techniques for compacting a hierarchical structure as it is have been proposed.

Such techniques include a bottom-up method and a pitch matching method. The bottom-up method compacts hierarchical cells of a given circuit from the bottom to the top. This method rewires a higher cell to a lower cell according to one of the routing techniques, in particular, the river routing technique, which wires terminals to one another in a single layer without intersections. The pitch matching method matches the pitches of terminals of cells with each other and connects the cells to each other while compacting them. The pitch matching method needs no rewiring.

Japanese Unexamined Patent Publication No. 6-58469 proposes a compromise of the bottom-up and pitch matching methods. Like the bottom-up method, the disclosure compacts hierarchical cells of a circuit sequentially from the bottom to the top. When compacting a given cell, the disclosure sets compaction constraints to restrict the movements of terminals of the cell connected to a higher cell. This makes the routing of the higher cell to the lower cell easier, like the pitch matching method.

The disclosure needs a router tool or a routing routine to connect terminals of adjacent cells to each other. In addition, the disclosure must manually connect breaks, if any. The disclosure, therefore, is troublesome for the user.

The bottom-up method has the same problem as the above disclosure because it must rewire a higher cell to a lower cell. Since the bottom-up method never adjusts the size of a lower cell, it needs a wiring area to deteriorate compaction effect.

On the other hand, the pitch matching method adjusts the pitches of terminals of hierarchical cells, to cancel the bad effect of a wiring area between cells. The pitches, however, are adjustable only when the cells are regularly arranged. If they are irregular, compaction will be stopped to provide no layout. Accordingly, the pitch matching method has limited applications. In addition, the method needs a long processing time, and therefore, is impractical.

SUMMARY OF THE INVENTION

An object of the present invention is to provide a method of generating a hierarchical layout of cells of a semiconductor integrated circuit, capable of connecting terminals of adjacent cells to each other and reducing the area of the circuit without using routing algorithms and without causing breaks in connections.

Another object of the present invention is to provide a method of generating a hierarchical layout of cells of a semiconductor integrated circuit, capable of compacting the layout without rewiring or breaks.

Still another object of the present invention is to provide a method of generating a layout of a semiconductor integrated circuit, applicable in various ways.

In order to accomplish the objects, an aspect of the present invention provides a method of generating a layout of cells of a semiconductor integrated circuit, including the steps of selecting, among the cells, a target cell having first and second terminals to be connected to each other, replacing a part of the target cell, which covers the second terminals and lines extending therefrom, with an abstract cell with the second terminals being on an edge of the abstract cell, setting the positions of the second terminals on the abstract cell as compaction constraints on the first terminals, extending jogged lines from the first terminals toward the second terminals, respectively, to reach the edge of the abstract cell, moving the first terminals having the compaction constraints to intersections between the jogged lines and the edge of the abstract cell, compacting the target cell, and returning the abstract cell to the part of the target cell.

This aspect of the invention connects the first and second terminals to each other without routing algorithms and without causing many breaks and compacts the circuit.

Another aspect of the present invention provides a method of generating a layout of cells of a semiconductor integrated circuit, including the steps of selecting, among the cells, a target cell having first and second terminals to be connected to each other, replacing a part of the target cell, which covers the second terminals and lines extending therefrom, with an abstract cell with the second terminals being on an edge of the abstract cell, reducing the size of the abstract cell, to form a virtual channel area, setting the positions of the second terminals on the abstract cell as compaction constraints on the first terminals, setting a compact size as a compaction constraint on the abstract cell, extending jogged lines from the first terminals up to the edge of the abstract cell through the virtual channel area, moving the first terminals having the compaction constraints to intersections between the jogged lines and the edge of the abstract cell, compacting the target cell, and returning the abstract cell to the part of the target cell.

This aspect of the invention prevents breaks between the target and abstract cells even if compaction constraints are released during a compaction process. Forming the virtual channel area is effective when cells of the same hierarchical level are connected to each other through terminals without connection lines.

If there are breaks between the first and second terminals after compacting the target cell, still another aspect of the present invention zeroes the breaks by repeating the steps of comparing the positions of each pair of the first and second terminals on the edge of the abstract cell, to determine a direction from the first terminal to the second terminal, reducing the size of the abstract cell, to form a virtual channel area, setting the positions of the second terminals on the abstract cell as compaction constraints on the first terminals, setting a compact size as a compaction constraint on the abstract cell, extending jogged lines from the first terminals toward the second terminals through the virtual channel area according to the determined directions, moving the first terminals having the compaction constraints to intersections between the jogged lines and the edge of the abstract cell, and compacting the target cell.

This aspect of the invention is capable of zeroing breaks between adjacent cells, if any.

Still another aspect of the present invention provides a method of generating a layout of cells of a semiconductor integrated circuit, including the steps of selecting, among the cells, a target cell having first and second terminals to be connected to each other, replacing a part of the target cell, which covers the second terminals and lines extending therefrom, with an abstract cell with the second terminals being on an edge of the abstract cell, setting the positions of the second terminals on the abstract cell as compaction constraints on the first terminals, extending jogged lines from the first terminals toward the second terminals, respectively, to reach the edge of the abstract cell, moving the first terminals having the compaction constraints to intersections between the jogged lines and the edge of the abstract cell, compacting the target cell, and repeating these steps.

Still another aspect of the present invention provides a method of generating a hierarchical layout of cells of a semiconductor integrated circuit from the bottom to the top of the hierarchy of cells, including the steps of selecting, among the cells, a target cell having a lower cell, replacing the lower cell with an abstract cell whose periphery is identical to that of an uncompacted form of the lower cell and which has terminals whose positions agree with those of the uncompacted form of the lower cell, setting the positions of the terminals on the lower cell as compaction constraints on the terminals of the abstract cell, setting a compact size of the lower cell as a compaction constraint on the abstract cell, compacting the target cell, and replacing the abstract cell with a compacted lower cell.

The conventional bottom-up method that compacts a hierarchical structure of a semiconductor integrated circuit as it is must (1) properly arrange a compacted lower cell in a target cell and (2) rewires the target cell to the lower cell. The above aspect of the present invention requires none of these two conventional processes (1) and (2). In connection with the process (1), the present invention puts a compact size of a lower cell as a compaction constraint on an abstract cell to be formed in a target cell. As a result, the size of the abstract cell after compaction will be equal to that of the compacted lower cell, and therefore, the compacted abstract cell will simply be replaced with the compacted lower cell. In connection with the process (2), the present invention puts the positions of terminals of a lower cell as compaction constraints on terminals of an abstract cell to be formed in a target cell. As a result, the terminals of the abstract cell after compaction correctly match with the terminals of the compacted lower cell.

The preceding aspect of the present invention may include the steps of reducing the size of the abstract cell, to form a virtual channel area after the lower cell is replaced with the abstract cell, extending jogged lines from the terminals of the abstract cell up to an edge of the reduced abstract cell through the virtual channel area after the compaction constraints have been set, moving the terminals of the abstract cell having the compaction constraints to intersections between the jogged lines and the edge of the reduced abstract cell, and compacting the target cell.

Even if the compaction constraints put on the terminals of the abstract cell are released, this aspect greatly reduces breaks between the target and lower cells. The compaction constraints put on the terminals of the abstract cell will be released if lines of the target cell extending toward the terminals of the abstract cell are unable to bend orthogonally. To solve this problem, the present invention arranges jogged lines in the virtual channel area, which is formed by reducing the size of the abstract cell. The abstract cell can be reduced because its original size is optional.

If there are breaks between the target and lower cells after compacting the target cell, the breaks are zeroed by repeating the steps of comparing the positions of terminals of the abstract and lower cells on the edge of the abstract cell, to determine directions from the terminals of the abstract cell to the terminals of the lower cell, reducing the size of the abstract cell, to form a virtual channel area, setting the positions of the terminals of the lower cell as compaction constraints on the terminals of the abstract cell, setting the size of the compacted lower cell as a compaction constraint on the abstract cell, extending jogged lines from the terminals of the abstract cell toward the edge of the reduced abstract cell through the virtual channel area according to the determined directions, moving the terminals of the abstract cell having the compaction constraints to intersections between the jogged lines and the edge of the reduced abstract cell, and compacting the target cell.

If the compaction constraints are released to cause a break between terminals, a jogged line is extended from one of the terminals toward the other, and the target cell is compacted. Before the jogged line is deleted as unnecessary, the target and lower cells are connected to each other. This aspect of the invention zeroes breaks between the target and lower cells.

Lines of the target cell may be constrained so that they are connected to the terminals of the abstract cell. Terminals of the target cell may be constrained to be movable within a given range.

The movements of terminals of the target cell to be connected to a higher cell may be constrained so that the terminals are easily connected to the higher cell.

The positions of terminals of the abstract cell may be determined according to the shapes of lines of the target and lower cells to be connected to each other.

The abstract cell is formed at a correct position, and the terminals are correctly connected to each other without breaks even if the lines of the target cell run along the lower cell.

BRIEF DESCRIPTION OF THE DRAWINGS

These and other objects, features, embodiments and advantages of the present invention will become more apparent form the following detailed description of the present invention when taken in conjunction with the accompanying drawings, in which:

FIGS. 22A to 22C show forming a terminal of an abstract cell according to a seventh embodiment of the present invention;

FIG. 23 shows forming a terminal of an abstract cell according to the seventh embodiment;

FIG. 29 is a flowchart showing a ninth embodiment of the present invention;

DETAILED DESCRIPTION OF THE EMBODIMENTS

Various embodiments of the present invention will be described with reference to the accompanying drawings.

First embodiment

Figure 1:
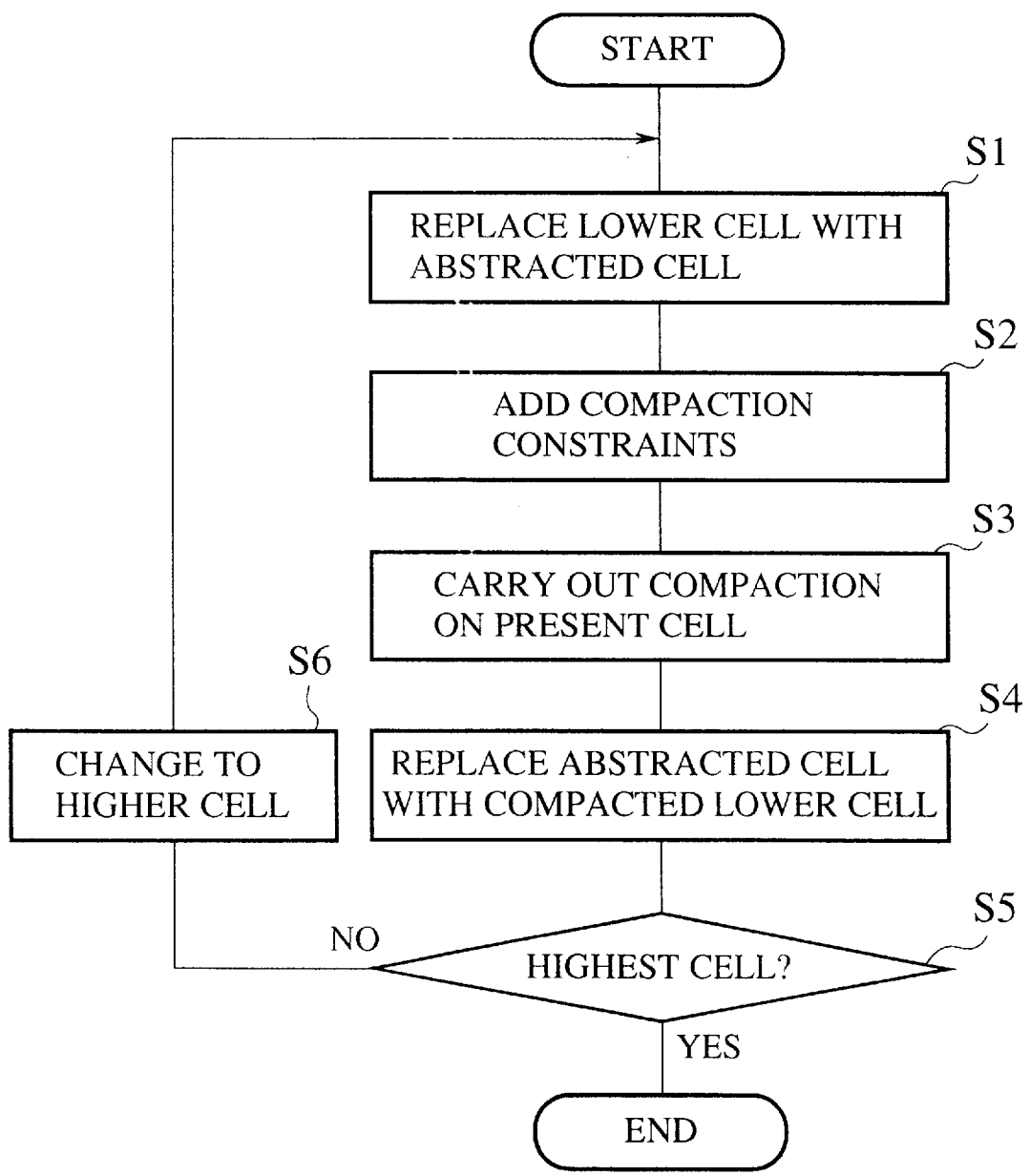
FIG. 1 is a flowchart showing a first embodiment of the present invention.
Figure 2:
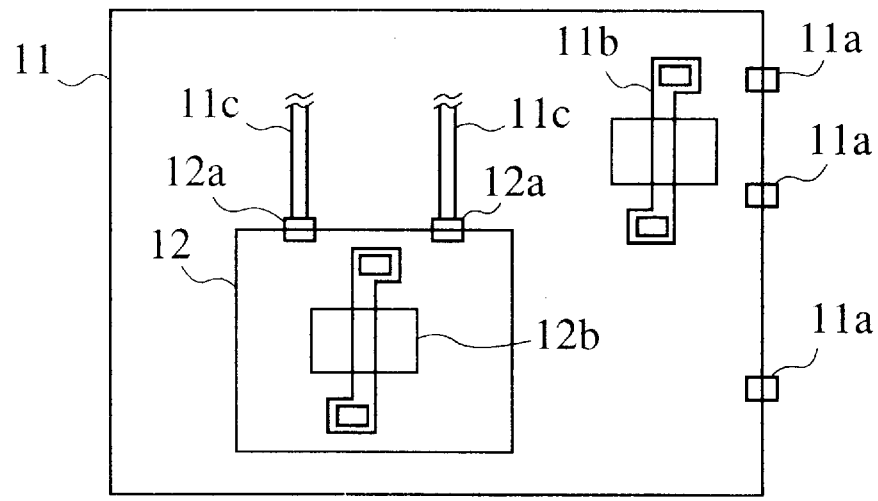
FIG. 2 shows a target cell according to the first embodiment.
Figure 3A:
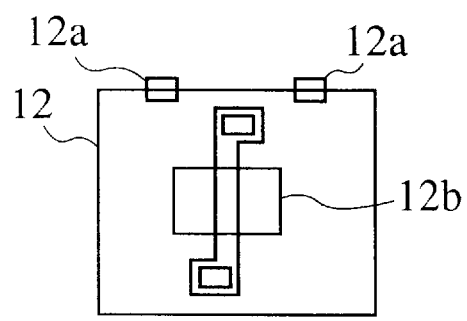
FIGS. 3A and 3B show a lower cell before and after compaction.
Figure 3B:
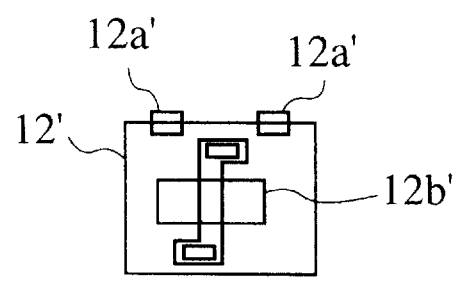

FIG. 1 is a flowchart showing a method of generating a hierarchical layout of cells of a semiconductor integrated circuit according to the first embodiment. FIG. 2 shows a target cell and a lower cell among the hierarchy of cells of the circuit. FIGS. 3A and 3B show the lower cell before and after compaction.

In FIG. 2, the target cell 11 has terminals 11a, a circuit pattern 11b, and wires or lines 11c. The lower cell 12 is lower than the target cell 11 in the hierarchy. The lower cell 12 has terminals 12a and a circuit pattern 12b. The lines 11c are connected to the terminals 12a.

FIG. 3A shows the lower cell 12 before compaction, and FIG. 3B shows the same after compaction. The compacted lower cell 12' has terminals 12a' and a circuit pattern 12b'.

Figure 4:
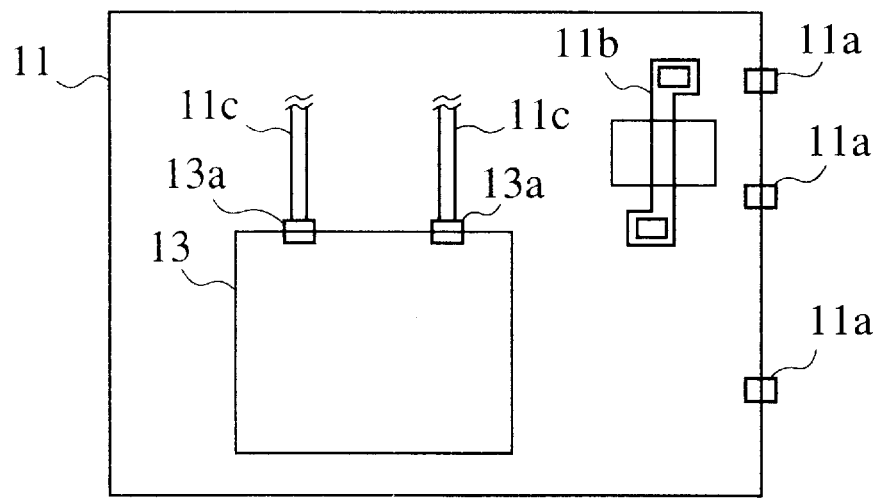
FIG. 4 shows the target cell with the lower cell being replaced with an abstract cell.

Returning to FIG. 1, step S1 abstracts the periphery and terminals of the lower cell 12 into an abstract cell 13. The size of the abstract cell 13 is equal to that of the lower cell 12 before compaction. Terminals 13a of the abstract cell 13 are in contact with the lines 11c of the target cell 11 as shown in FIG. 4.

Figure 5A:
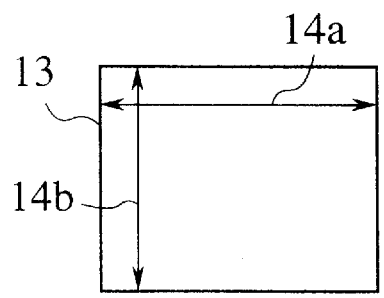
FIGS. 5A and 5B show compaction constraints put on the abstract cell.
Figure 5B:
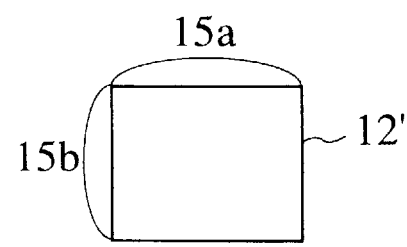

Step S2 applies compaction constrains to the abstract cell 13 as follows:

(1) The abstract cell 13 is constrained so that the size thereof after compaction is equal to the size of the compacted lower cell 12'. FIG. 5A shows the abstract cell 13 having compaction constraints 14a and 14b. FIG. 5B shows the compacted lower cell 12' having sizes 15a and 15b. The constraints 14a and 14b are determined according to the sizes 15a and 15b, respectively.

Figure 6A:
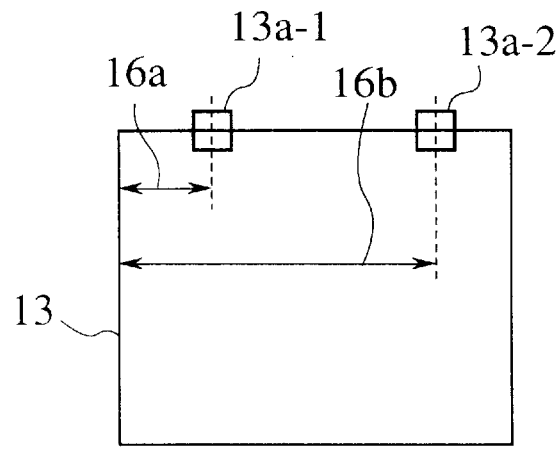
FIGS. 6A and 6B show compaction constraints put on terminals of the abstract cell.
Figure 6B:
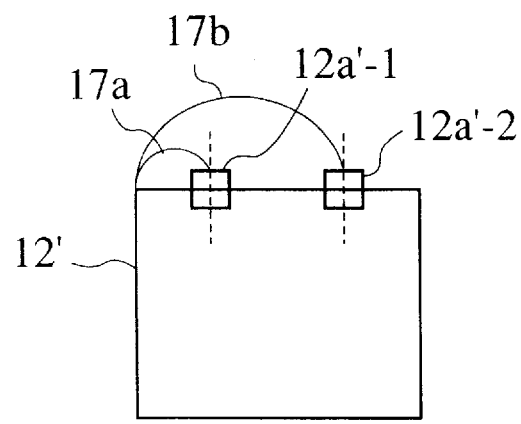

(2) The terminals 13a of the abstract cell 13 are constrained to connect the abstract cell 13 to the target cell 11. FIG. 6A shows the abstract cell 13 having terminals 13a-1 and 13a-2 on which constraints 16a and 16b are put. FIG. 6B shows the compacted lower cell 12' having terminals 12a'-1 and 12a'-2 whose relative positions from an edge are 17a and 17b. The relative positions 17a and 17b are used to determine the constraints 16a and 16b, respectively. These constraints 16a and 16b correspond to the relative positions of the terminals 13a-1 and 13a-2 from an edge of the abstract cell 13.

Alternatively, the terminal 13a-1 nearest to the edge of the abstract cell 13 may be constrained according to the relative position 17a, and the other terminals of the abstract cell 13 including the terminal 13a-2 may be constrained according to a relative position with respect to an adjacent terminal.

Step S3 compacts the target cell 11. Step S4 returns the abstract cell 13 to the compacted lower cell 12'.

Step S5 determines whether or not the target cell 11 is the highest in the hierarchy. If it is the highest, the flow ends. If it is not, step S6 sets the next higher cell as a target cell, and steps S1 to S5 are repeated.

In this way, steps S1 to S4 compact a hierarchy of cells of a given semiconductor circuit from the bottom to the top of the hierarchy.

If compaction constraints are excessive, some of the lines 11c of the target cell 11 will not be in contact with the terminals 12a of the lower cell 12. This problem will be solved by one of the other embodiments or one of the river routing, line search routing, maze routing, and channel routing techniques.

The conventional bottom-up method compacts a hierarchical layout of cells of a semiconductor integrated circuit sequentially from the bottom to the top of the hierarchy. This method rewires breaks among connections between adjacent cells, if any. When compacting a target cell, the prior art must (1) position a compacted lower cell in the target cell and (2) rewire the target cell to the lower cell.

The first embodiment of the present invention is capable of compacting the target cell without the two processes (1) and (2) of the prior art.

When a target cell having a compacted lower cell is given, the first embodiment replaces the lower cell with an abstract cell whose size is equal to the size of the lower cell before compaction, and puts compaction constraints on the abstract cell so that the size of the abstract cell after compaction will be equal to the size of the compacted lower cell. The target cell usually has many objects such as lines and terminals, and the present invention may individually specify rules, i.e., compaction constraints for the objects. For example, a distance between given objects may be fixed to provide a constraint.

As a result, the size of the abstract cell after compaction will precisely be equal to the size of the compacted lower cell, and the abstract cell is simply replaced with the compacted lower cell, to complete the compaction.

The first embodiment constrains terminals of an abstract cell according to terminals of a compacted lower cell. As a result, the terminals of the abstract cell after compaction will overlap the terminals of the compacted lower cell. For example, the first embodiment measures the distances of terminals that are on a top edge of the compacted lower cell from a left edge of the same cell, and constrains the distances of corresponding terminals of the abstract cell from a left edge thereof. Namely, the first embodiment specifies the relative positions of the terminals of the abstract cell from the left edge thereof. After the abstract cell is compacted, the terminals thereof correctly overlap the terminals of the compacted lower cell, to connect the target cell to the lower cell.

In this way, the first embodiment compacts a hierarchical layout of cells of a semiconductor integrated circuit from the bottom to the top of the hierarchy without breaks or rewiring.

Second embodiment

A method of generating a hierarchical layout of cells of a semiconductor integrated circuit according to the second embodiment will be explained.

According to the first embodiment, compaction constraints put on terminals of an abstract cell are sometimes released due to some reason. If they are released and the abstract cell is compacted, the terminals thereof will not coincide with terminals of a compacted lower cell, to cause breaks between the terminals of target and lower cells. The compaction constraints are released when there are some obstacles against compaction. If the number of breaks between the target and lower cells is small, they can be corrected manually. If the number is large, manual correction is impossible. The second embodiment solves this problem.

Compaction constraints on the terminals of an abstract cell will be released if lines of a target cell that are connected to the terminals of the abstract cell are unable to move orthogonally during compaction. If the lines of the target cell are bent orthogonally, or if a compactor has a function of bending the lines of the target cell, the problem will be solved. Namely, the second embodiment forms jogged lines between the target and abstract cells.

This technique needs a space for the jogged lines. Preparing such a space according to the second embodiment will be explained.

A lower cell of a target cell is replaced with an abstract cell, and the size of the abstract cell is compacted and equalized with the size of a compacted lower cell. This means that the original size of the abstract cell is optional. Accordingly, the second embodiment reduces the size of the abstract cell, to form an assumed routing area, i.e., a virtual channel area in which jogged lines are to be formed. The scale of a size reduction in the abstract cell must be a minimum necessary for arranging orthogonal components in the lines that connect the terminals of the target and abstract cells to each other. If no orthogonal components are needed, the virtual channel area is deleted. The terminals of the abstract cell having compaction constraints are moved to intersections between the jogged lines formed in the virtual channel area and an edge of the reduced abstract cell. This results in greatly reducing breaks between the target and lower cells after compaction.

Figure 7:
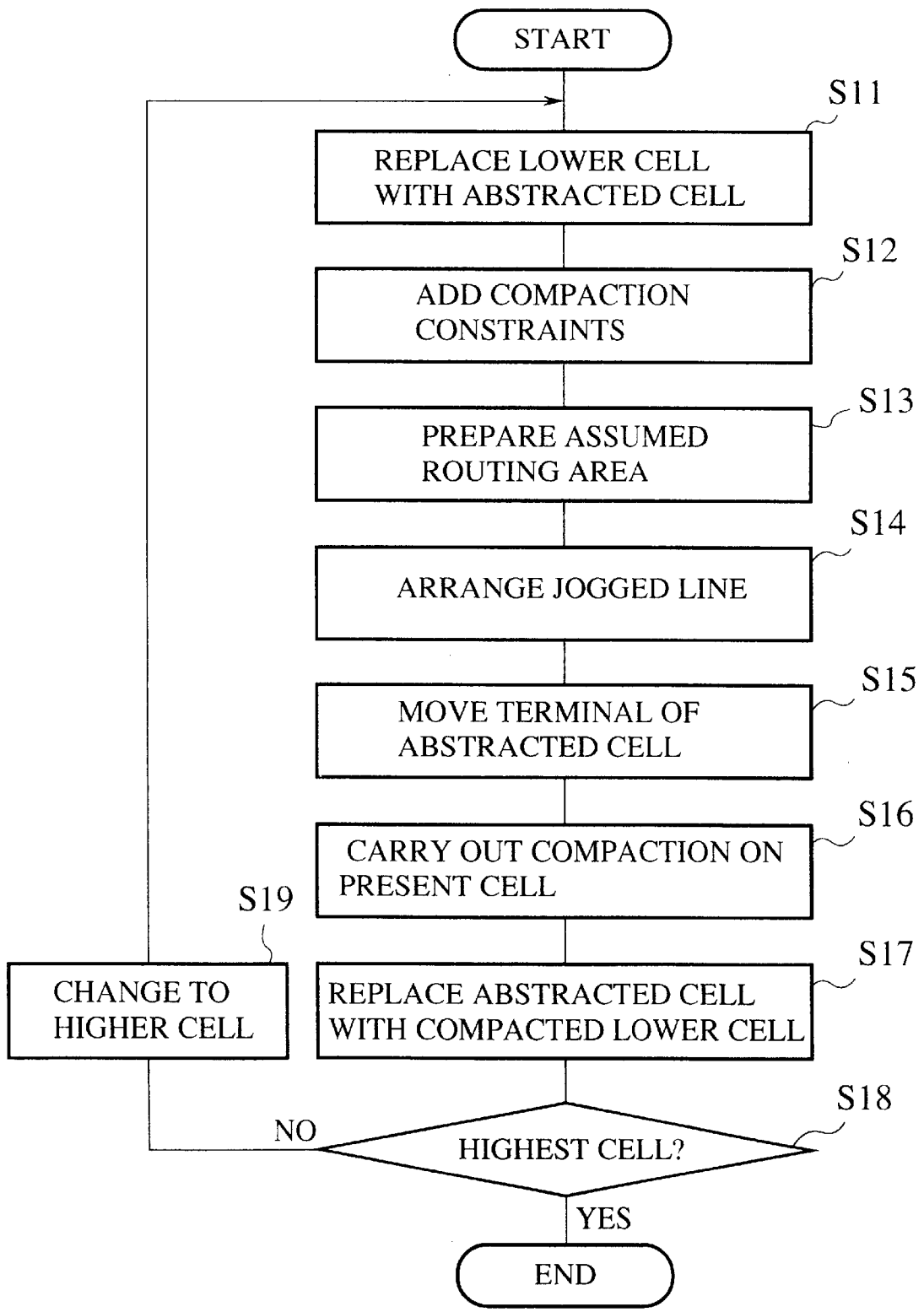
FIG. 7 is a flowchart showing a second embodiment of the present invention.

FIG. 7 is a flowchart showing the second embodiment.

Steps S13 to S15 are specific to the second embodiment, and the other steps are the same as those of FIG. 1. Namely, steps S11 and S12 of FIG. 7 correspond to steps S1 and S2 of FIG. 1, and steps S16 to S19 of FIG. 7 correspond to steps S3 to S6 of FIG. 1. Step S11 replaces a lower cell 12 in a target cell 11 with an abstract cell 13. Step S12 applies compaction constraints on the abstract cell 13.

Figure 8:
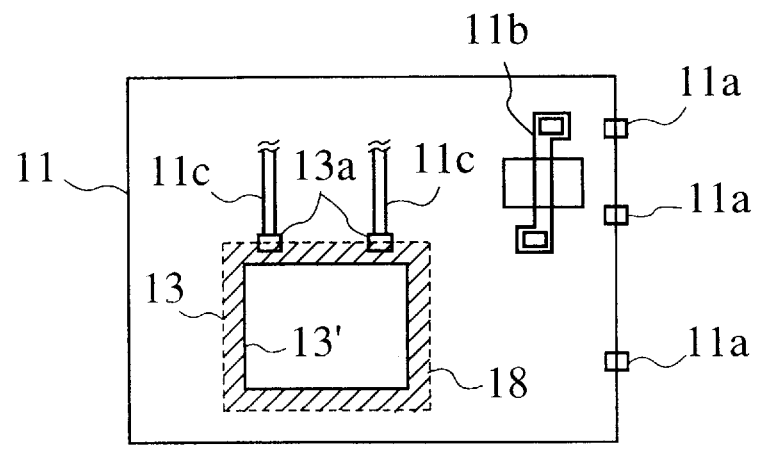
FIG. 8 shows a virtual channel area according to the second embodiment.

Step S13 reduces the abstract cell 13 into a reduced abstract cell 13' while keeping the compaction constraints, to form an assumed routing area, i.e., a virtual channel area 18 as shown in FIG. 8.

Figure 9:
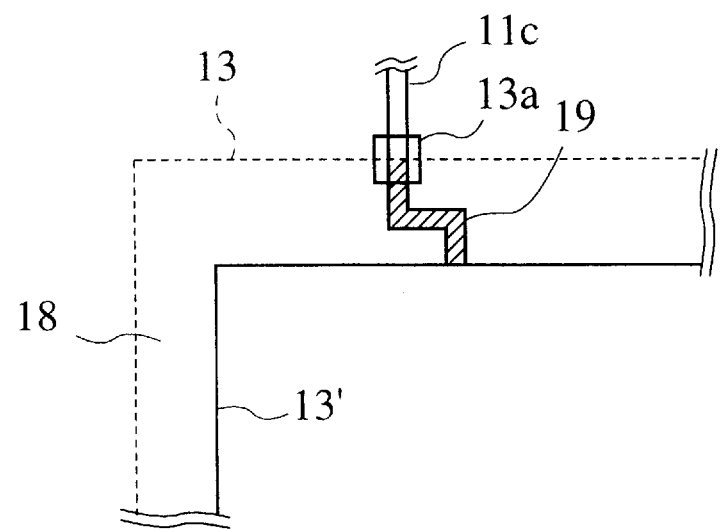
FIG. 9 shows a jogged line according to the second embodiment.

Step S14 forms a jogged line 19 that starts a terminal 13a on an edge of the original abstract cell 13 and extends in the virtual channel area 18 up to an edge of the reduced abstract cell 13', as shown in FIG. 9.

FIGS. 10A to 10D show examples of the jogged line 19. The jogged line 19 has a jog 19a. When a jog is given, a compactor bends a line in question accordingly.

Figure 10:
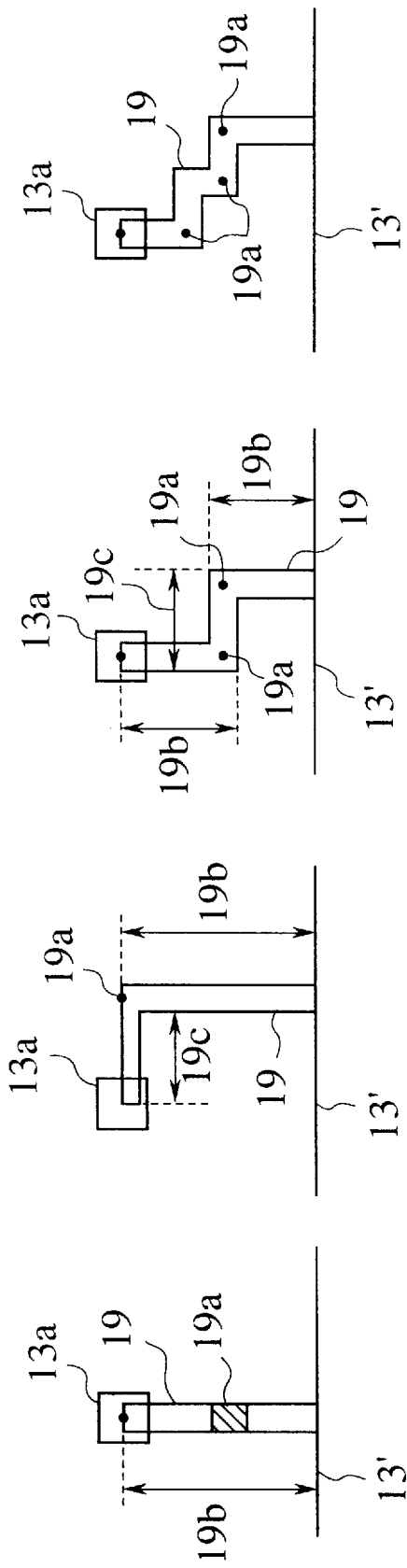
FIGS. 10A to 10D show examples of the jogged line.

The jog 19a is not always a bend. It may be straight as shown in FIG. 10A. Each jogged line 19 has a segment having a length of 19b and a segment having a length of 19c. These lengths must comply with a reduction applied to the abstract cell 13 in step S13 and may be fixed values. This is the feature of the present invention not suggested by the prior arts. According to our experiments, jogged lines of FIGS. 10C and 10D are best to reduce breaks and are easy to form.

Figure 11:
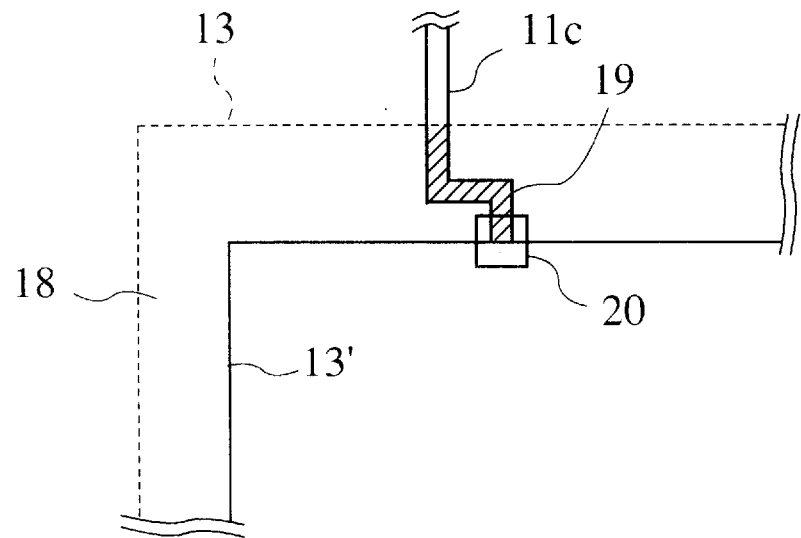
FIG. 11 shows a terminal of an abstract cell moved according to the second embodiment.

Step S15 moves the terminal 13a of the abstract cell 13 to an intersection between the jogged line 19 and an edge of the reduced abstract cell 13', to form a terminal 20 shown in FIG. 11.

Figure 12:
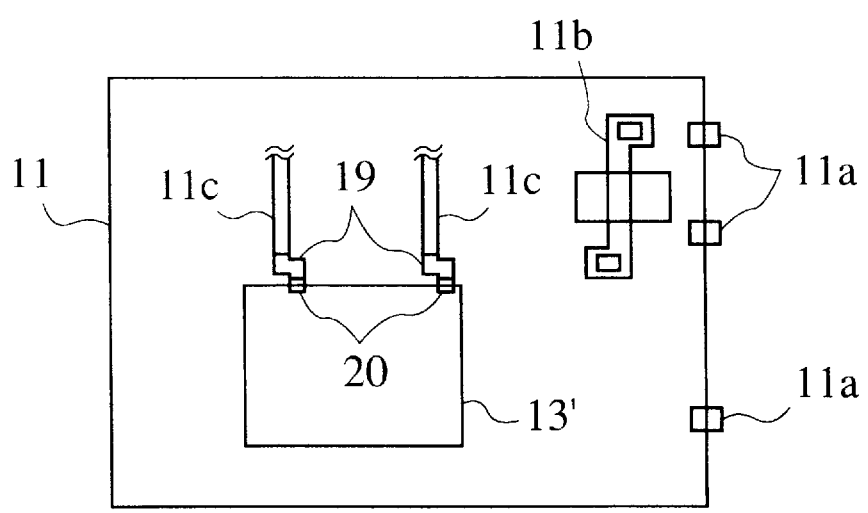
FIG. 12 shows a target cell before compaction according to the second embodiment.

FIG. 12 shows the target cell 11 with the reduced abstract cell 13' processed through steps S13 to S15. Step S16 compacts the target cell 11. The number of breaks between the target cell 11 and the lower cell 13' is smaller than that of the first embodiment. The compactor deletes useless jogged lines from the layout after compaction. Consequently, the second embodiment connects the target cell to the lower cell without a useless space.

Third embodiment

A method of generating a hierarchical layout of cells of a semiconductor integrated circuit according to the third embodiment will be explained.

Although the second embodiment greatly reduces the number of breaks between adjacent cells of a given semiconductor integrated circuit, it is unable to completely eliminate breaks. This is because effective jogged lines are sometimes deleted by compactor during a useless jogged line deleting process. Accordingly, it is necessary to connect adjacent cells to each other before the deleting process. Namely, compaction constraints must be fulfilled before the deleting process.

For this purpose, the third embodiment bends a line toward a terminal of a given cell to which the line must be connected. This process is carried out to any terminal whose compaction constraint has been released. This results in reducing the number of breaks between adjacent cells, and iterating this process will substantially zero the number of breaks between the adjacent cells.

Figure 13:
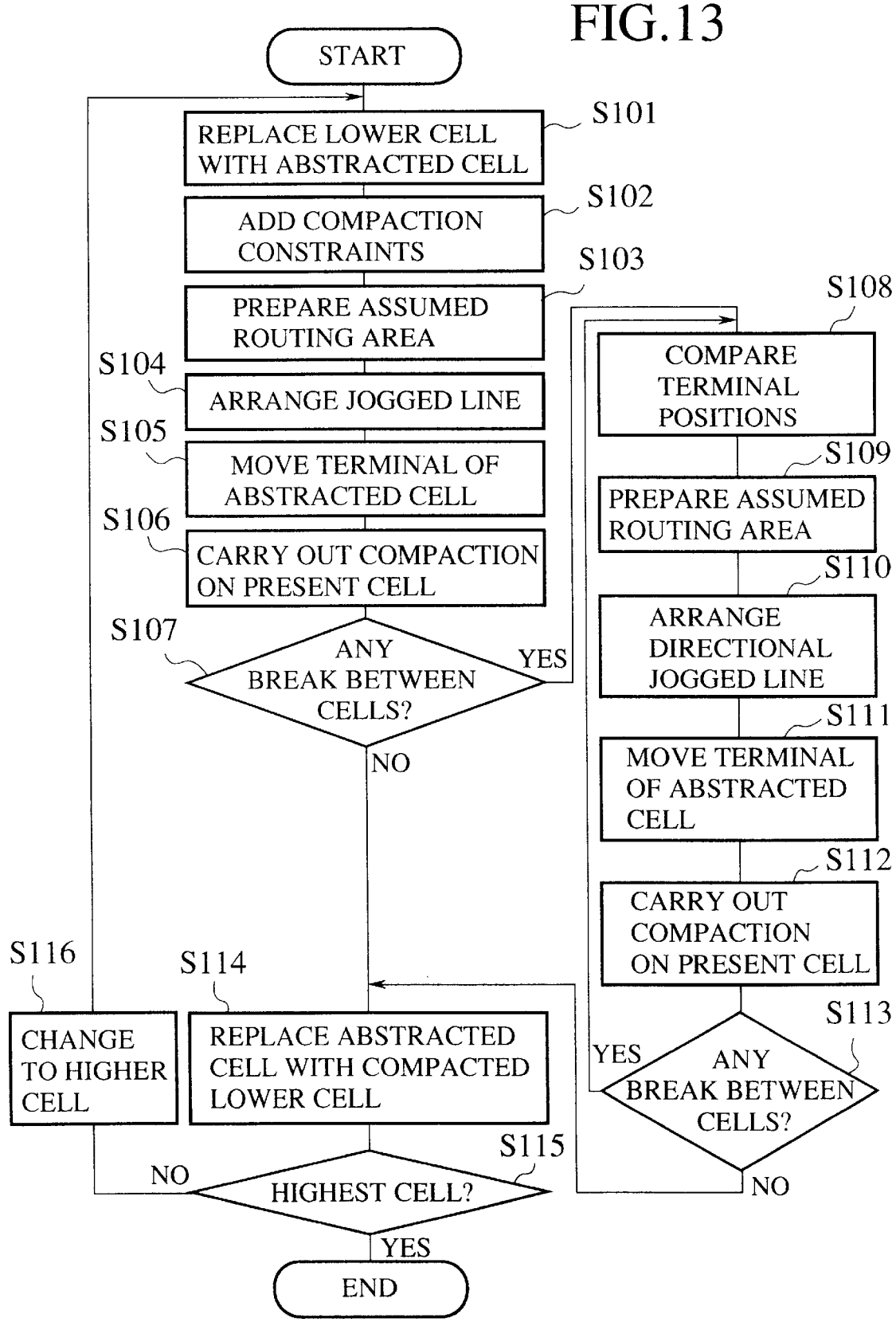
FIG. 13 is a flowchart showing a third embodiment of the present invention.

FIG. 13 is a flowchart showing the third embodiment.

Figure 14:
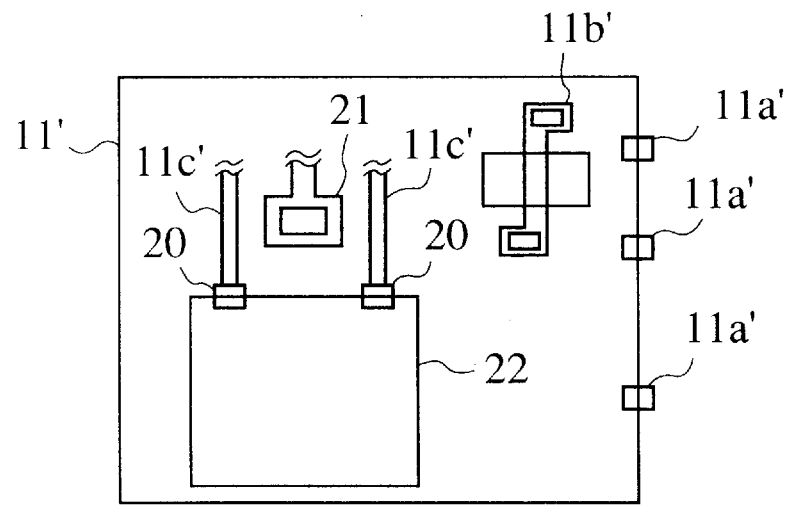
FIG. 14 shows a target cell after compaction according to the third embodiment.

Steps S107 to S113 are specific to the third embodiment. The other steps of FIG. 13 are the same as those of FIG. 7. Namely, steps S101 to S106 of FIG. 13 correspond to steps S11 to S16 of FIG. 7, and steps S114 to S116 of FIG. 13 correspond to steps S17 to S19 of FIG. 7. Steps S101 to S106 compact a target cell 11 into a compacted target cell 11' shown in FIG. 14. Step S107 determines whether or not there is any break between the target cell 11' and a reduced abstract cell 22. If there is no break, step S114 is carried out.

If there is any break, steps S108 to S113 are carried out. The compacted target cell 11' has lines 11c', a circuit pattern 11b', terminals 11a', and a circuit pattern 21 that causes the break.

Step S108 checks the position of the terminal 20 of the abstract cell 22 that has the break with respect to a terminal 12a' of a compacted lower cell 12'.

Figure 15:
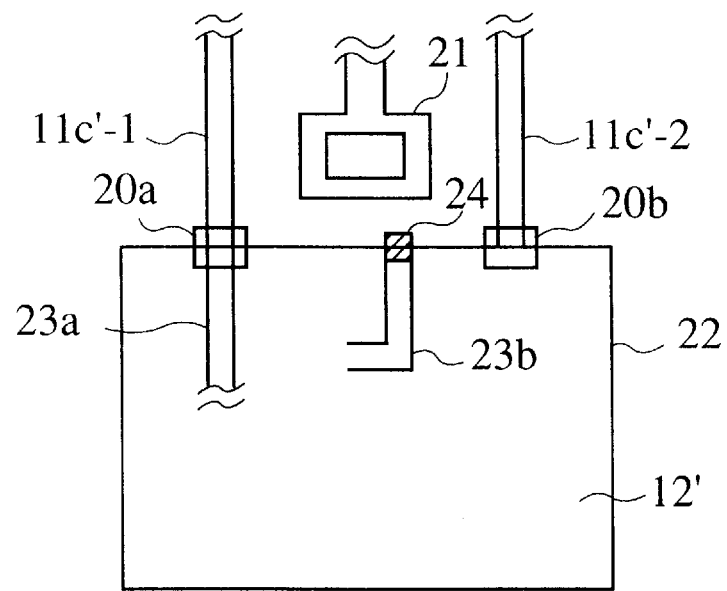
FIG. 15 shows a lower cell according to the third embodiment.
Figure 16A:
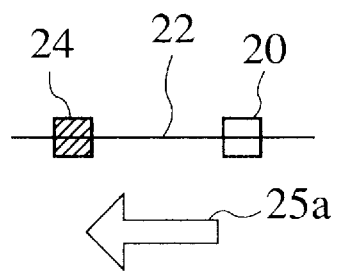
FIGS. 16A to 16D show examples of a relationship between terminals according to the third embodiment.
Figure 16B:
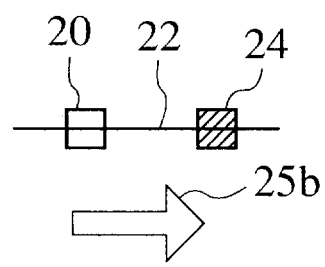
Figure 16C:
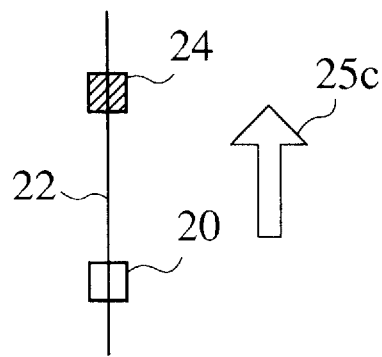
Figure 16D:
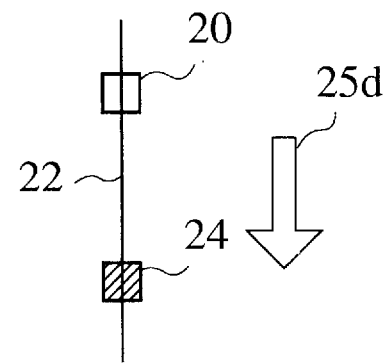
Figure 17A:
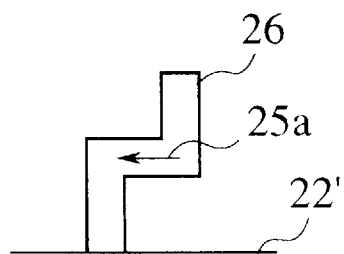
FIGS. 17A to 17D show jogged lines according to the third embodiment.
Figure 17B:
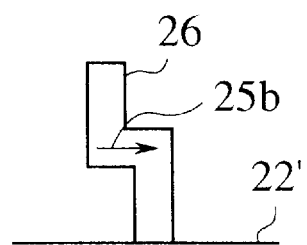
Figure 17C:
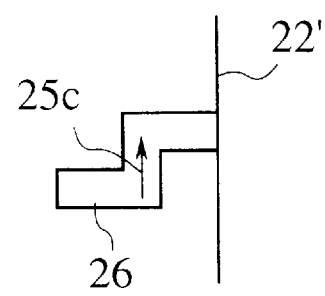
Figure 17D:
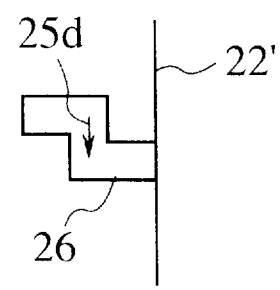

In FIG. 15, a line 23a of the lower cell 12' is successfully connected to a line 11c'-1 of the target cell 11' through a terminal 20a of the abstract cell 22. On the other hand, a line 23b of the lower cell 12' is unsuccessfully connected to a line 11c'-2 of the target cell 11' through a terminal 20b of the abstract cell 22 because the terminal 20b disagrees with a terminal 24 for the line 23b. Although the terminal 20b is constrained to meet the terminal 24, the circuit pattern 21 prevents this. Namely, the line 11c'-2 is unable to approach the terminal 24 due to the circuit pattern 21, and the compaction constraint on the terminal 20b is released to cause a break between the line 11c'-2 and the terminal 24. The terminal 20b of the abstract cell 22 is on the right side of the terminal 24 of the lower cell 12'. Step S108 detects this positional relationship.

FIGS. 16A to 16D show examples of the relationship between the terminals 20b and 24. Step S108 finds one of directions 25a to 25d shown in the figures. Since any successfully connected terminal has no directional dependency, step S108 carries out the directional detection only on each break between the target and lower cells.

Step S109 compacts the abstract cell 22 and forms a virtual channel area, similar to the second embodiment. Step S110 extends jogged lines 26 from the terminals 20 of the abstract cell 22 to the reduced abstract cell 22' through the virtual channel area according to the directions detected in step S108. FIGS. 17A to 17D show examples of the jogged lines 26.

Step S111 moves the terminals 20 of the abstract cell 22 to intersections between the jogged lines 26 and an edge of the reduced abstract cell 22', similar to the second embodiment.

Figure 18:
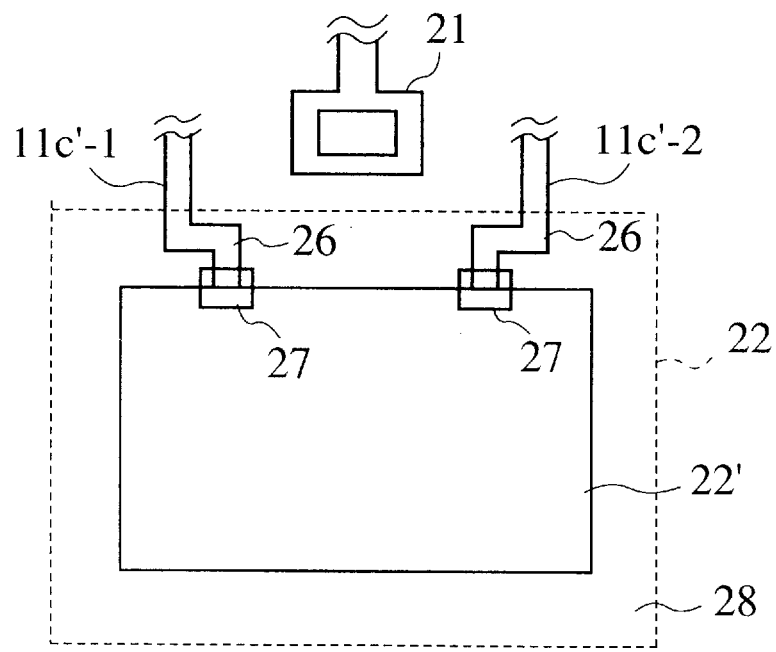
FIG. 18 shows jogged lines according to the third embodiment.

FIG. 18 shows the target cell processed through steps S108 to S111. The target cell has the moved terminal 27 on the abstract cell 22' and the virtual channel area 28.

Step S112 compacts the target cell. Step S113 determines whether or not there is any break. If there is no break, step S114 is carried out. If there is any break, steps S108 to S113 are repeated. This technique zeroes breaks between adjacent cells.

The fourth to sixth embodiments to reduce the number of breaks between adjacent cells according to the pitch matching technique will be explained. A given target cell usually has terminals to be connected to a higher cell. The embodiments put compaction constraints on these terminals before compaction, to limit the movements of the terminals and easily connect them to the higher cell. The compaction constraints on these terminals may not be necessary if the virtual channel area process is employed.

Fourth embodiment

The fourth embodiment differs from the preceding embodiments in step S2 of FIG. 1, step S12 of FIG. 7, and step S102 of FIG. 13.

Figure 19:
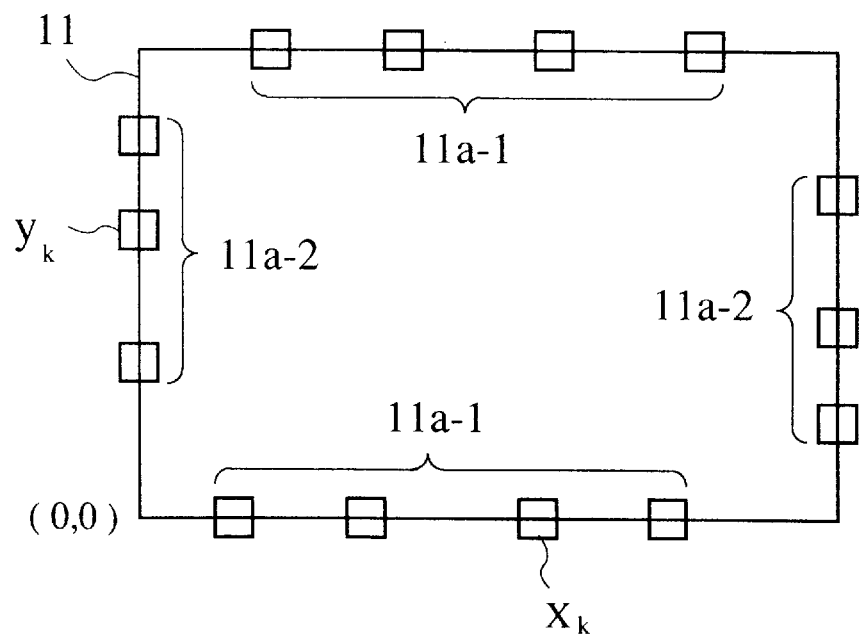
FIG. 19 shows compaction constraints according to a fourth embodiment of the present invention.

Namely, the fourth embodiment puts compaction constraints on terminals 11a-1 and 11a-2 of a target cell 11 of FIG. 19 so that the terminals may move only in a predetermined range.

The movements of the terminals 11a are restricted so that lines of a higher cell connected to the terminals 11a are not greatly moved during the compaction of the higher cell. The fourth embodiment achieves this by a combination of the bottom-up method and pitch matching method.

In FIG. 19, a lower left point of the target cell 11 serves as an origin.

The target cell 11 is compacted along an X-axis. The X-coordinate of any one of the terminals 11a-1 on the top and bottom edges of the target cell 11 is xk before compaction and xk' after compaction. Then, the following compaction constraint is applied:

$$a \cdot xk <= xk' <= b \cdot xk$$

where a and b are constants to be set by the user according to a compaction ratio in the X-axis direction.

If the target cell 11 is proportionally contracted by 10% along the X-axis, the coordinate xk of the terminal 11a-1 will move to 0.9xk. Accordingly, if a compaction ratio in the X-axis direction is about 10%, the constants a and b are set to move a terminal 11a-1 having an X-coordinate of xk to about 0.9xk. Namely, a=0.85 and b=1.05.

When the target cell 11 is compacted along a Y-axis, the Y-coordinate of any one of terminals 11a-2 on the left and right edges of the cell 11 is yk before compaction and yk' after compaction. In this case, the following compaction constraint is applied:

$$c \cdot yk <= yk' <= d \cdot yk$$

where c and d are constants determined according to a compaction ratio along the Y-axis.

Compacting the target cell 11 according to the above compaction constraints reduces the number of breaks between adjacent cells.

Fifth embodiment

Figure 20:
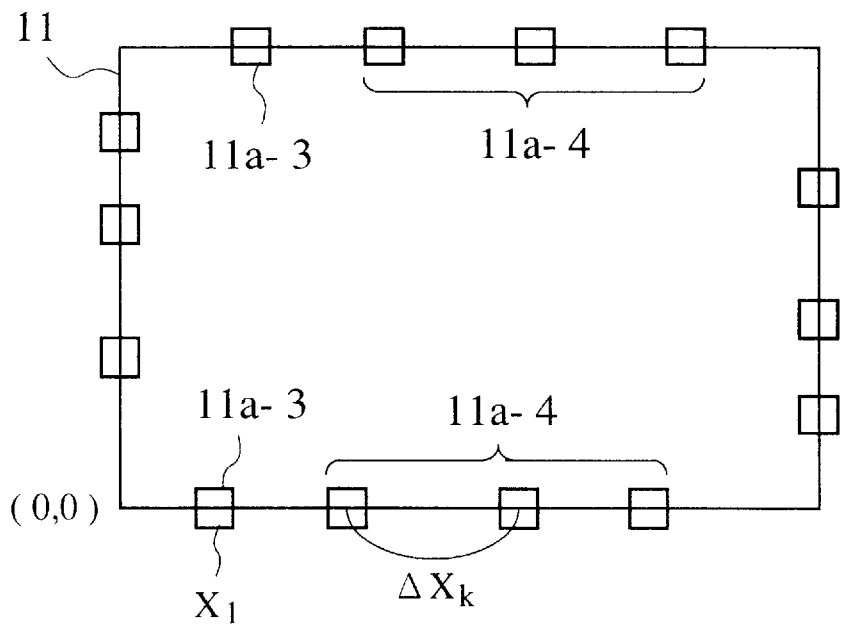
FIG. 20 shows compaction constraints according to a fifth embodiment of the present invention.

FIG. 20 shows compaction constraints according to the fifth embodiment.

A target cell 11 is compacted along an X-axis. A terminal 11a-3 is a leftmost terminal on each of the top and bottom edges of the target cell 11. The X-coordinate of each terminal 11a-3 is x1 before compaction and x1' after compaction. Compaction constraints are as follows:

$$a \cdot x1 <= x1' <= b \cdot x1$$

The other terminals on the top and bottom edges of the target cell 11 have each a distance of Δxk from the leftmost terminal 11a-3 before compaction and Δxk' after compaction. Compaction constraints are as follows:

$$a \cdot \Delta xk <= \Delta xk' <= b \cdot \Delta xk$$

where a and b are constants that are determined in the same manner as the fourth embodiment.

The target cell 11 is compacted along a Y-axis in the same manner.

According to the fourth embodiment, the positional relationships of terminals will be inverted if the terminals are close to one another. The fifth embodiment causes no such a problem.

Sixth embodiment

Figure 21:
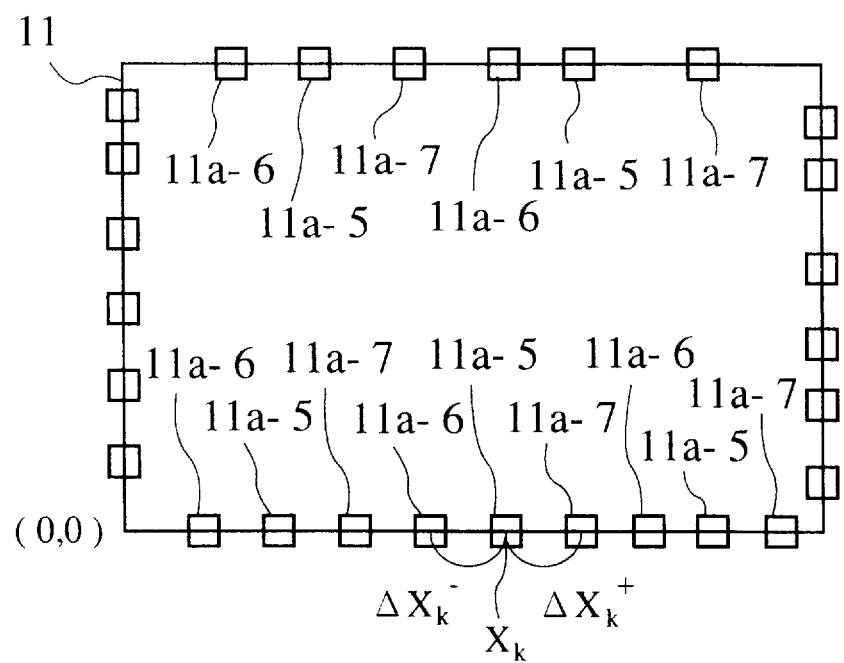
FIG. 21 shows compaction constraints according to a sixth embodiment of the present invention.

FIG. 21 shows compaction constraints according to the sixth embodiment.

A target cell 11 is compacted along an X-axis. Among terminals on each of the top and bottom edges of the target cell 11, a terminal 11a-5 is positioned at "3·N −1" (N=1, 2, ...). The X-coordinate of the terminal 11a-5 is xk before compaction and xk' after compaction. The following compaction constraint is applied:

$$i\ a \cdot xk <= xk' <= b \cdot xk$$

A terminal 11a-6 on the left side of the terminal 11a-5 has an X-coordinate of Δxk− before compaction and Δxk−' after compaction. A terminal 11a-7 on the right side of the terminal 11a-5 has an X-coordinate of Δxk+ before compaction and Δxk+' after compaction. The following compaction constraints are applied:

$$a \cdot \Delta xk- <= \Delta xk-' <= b \cdot \Delta xk-$$

$$a \cdot \Delta xk+ <= \Delta xk+' <= b \cdot \Delta xk+$$

The constants a and b are determined in the same manner as the fourth embodiment.

The target cell 11 is compacted along a Y-axis in the same manner.

Although the fifth embodiment never changes the positional relationships among terminals before and after compaction, it may greatly increase the moving distance of a given terminal on the top and bottom edges of a target cell when the position of the terminal is far from the left edge of the cell. To solve this problem, the sixth embodiment combines the fourth and fifth embodiments to suppress the moving distance of each terminal and prevent inversion of the positional relationships of terminals.

Seventh embodiment

A method of generating a hierarchical layout of cells of a semiconductor integrated circuit according to the seventh embodiment will be explained.

To reduce breaks, the seventh embodiment determines the positions of terminals of an abstract cell according to the shapes of lines of a target cell and lower cell that are connected to each other. This embodiment forms the terminals of the abstract cell at correct positions so that the terminals are not unnecessarily moved or disconnected even if the lines of the target cell run along the lower cell.

The seventh embodiment differs from the preceding embodiments in step S1 of FIG. 1, step S11 of FIG. 7, and step S101 of FIG. 13.

The seventh embodiment considers the shape of a line 11c of a target cell 11 and the shape of a line 31 of a lower cell 12 when determining the position of a terminal 13a of an abstract cell 13.

FIGS. 22A to 22C show three kinds of connections between the lines 11c and 31. A reference numeral 30 indicates a preferable position of the terminal of the abstract cell achieved by the seventh embodiment. If the terminal is formed at a position 30' of FIG. 22B, there will be a break between the target and lower cells, as shown in FIG. 23. In this figure, the target cell has lines 32a and 32b, and the lower cell has lines 31a and 31b. If the line 32a of the target cell is connected to the line 31a of the lower cell at the position 30', the line 32a prevents the line 32b from being connected to the line 31b.

If the terminal 13a of the abstract cell is formed at a position 29 of FIG. 22C, the terminal 13a will not be in contact with the line 11c of the target cell. In this case, additional compaction constraints are necessary. Accordingly, the seventh embodiment is effective to correctly connect a given target cell to a lower cell.

Eighth embodiment

A method of generating a hierarchical layout of cells of a semiconductor integrated circuit according to the eighth embodiment will be explained.

This embodiment processes a target cell having two lower cells abutting each other. Terminals of the lower cells are aligned and connected to each other. The flowcharts of the second to seventh embodiments are applicable to the eighth embodiment. Generally, it is difficult to compact a target cell involving lower cells that abut on each other. To forcibly achieve this, the pitch matching method is employed. The eighth embodiment realizes this by employing the virtual channel area process.

Figure 24:
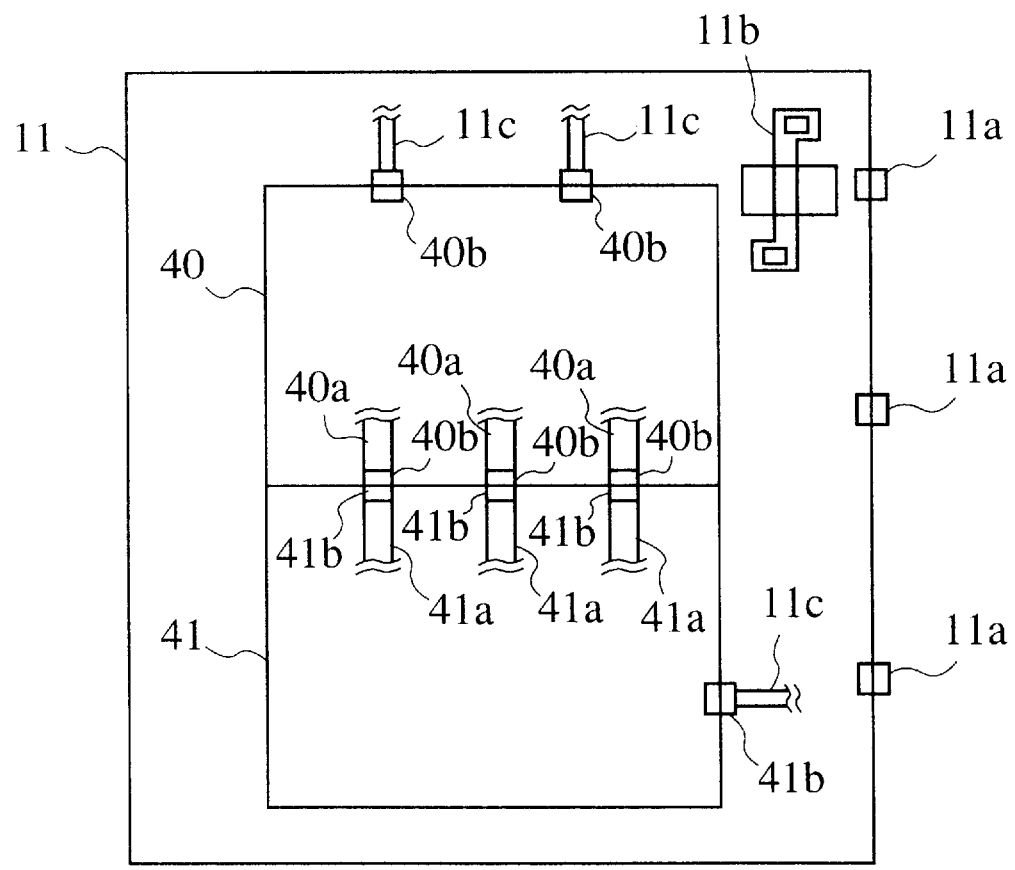
FIG. 24 shows a target cell according to an eighth embodiment of the present invention.

FIG. 24 shows a target cell 11 to be processed according to the eighth embodiment.

The target cell 11 has lower cells 40 and 41 abutting each other. The target cell 11 has terminals 11a, a circuit pattern 11b, and lines 11c to be connected to the lower cells 40 and 41.

The lower cell 40 has terminals 40b and lines 40a connected to the terminals 40b. The lower cell 41 has terminals 41b and lines 41a connected to the terminals 41b. The lower cells 40 and 41 abut on each other with the terminals 40b and 41b aligning with each other.

Figure 25:
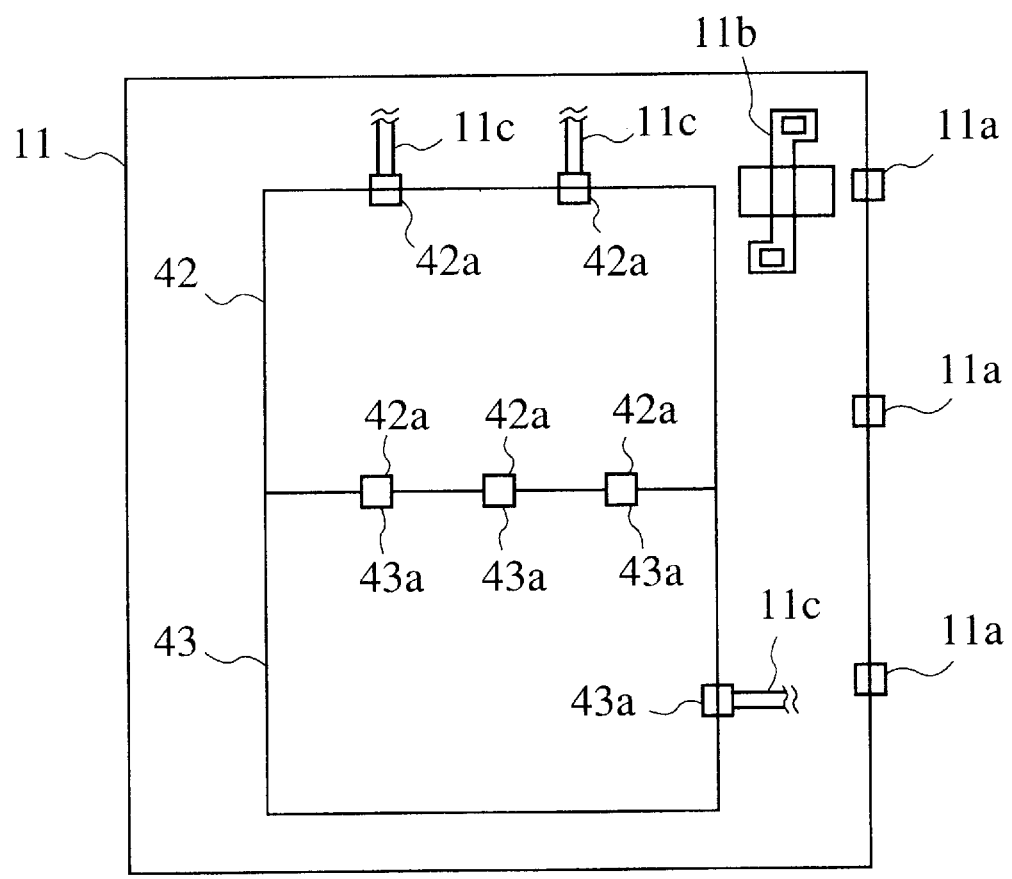
FIG. 25 shows lower cells according to the eighth embodiment.

The eighth embodiment will be explained with reference to the flowchart of FIG. 7. Step S11 replaces the lower cells 40 and 41 with abstract cells 42 and 43, and the terminals 40b and 41b with terminals 42a and 43a as shown in FIG. 25.

Figure 26:
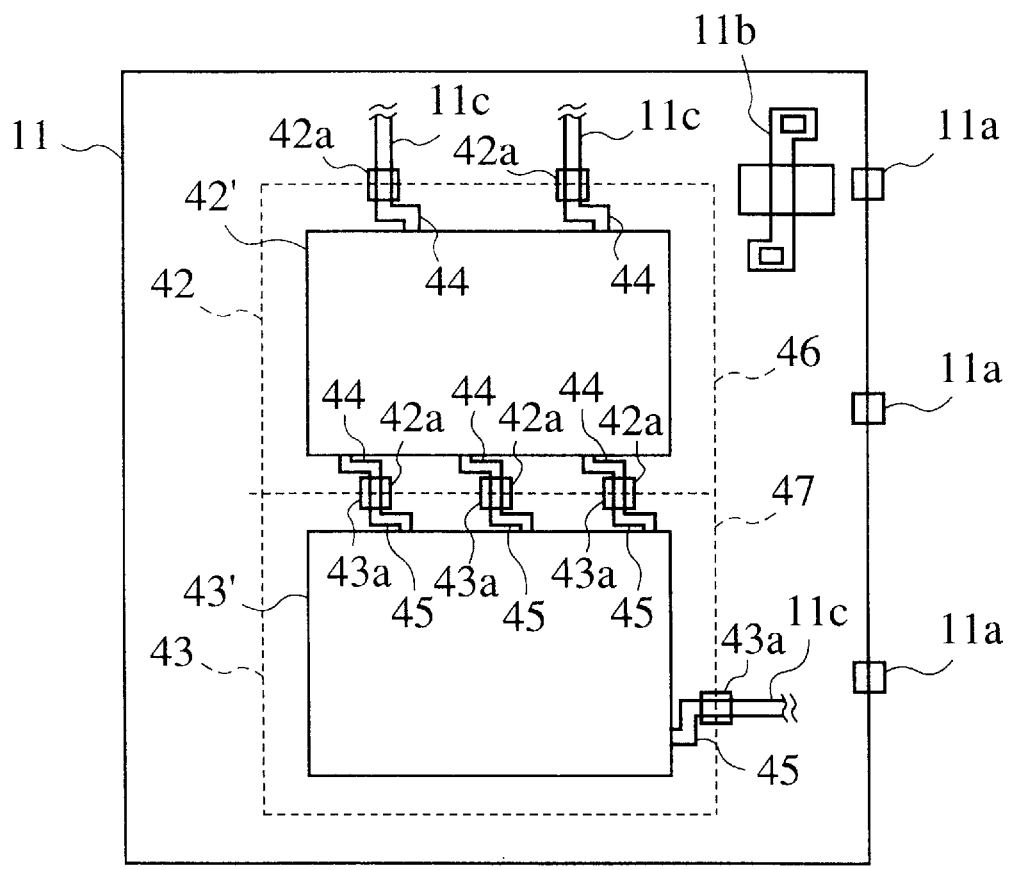
FIG. 26 shows compacted abstract cells and jogged lines according to the eighth embodiment.

Steps S12 to S14 put compaction constraints, form virtual channel areas 46 and 47 by reducing the abstract cells 42 and 43 into abstract cells 42' and 43', and arrange jogged lines 44 and 45 as shown in FIG. 26.

At the abutting boundary between the abstract cells, the jogged lines 44 and 45 extend on each side from the overlapping terminals 42a and 43a.

Step S15 moves the terminals 42a to the abstract cell 42', and the terminals 43a to the abstract cell 43'. The movements of the terminals 42a and 43a are constrained according to the terminal positions of compacted lower cells and must not be mixed together.

Figure 27:
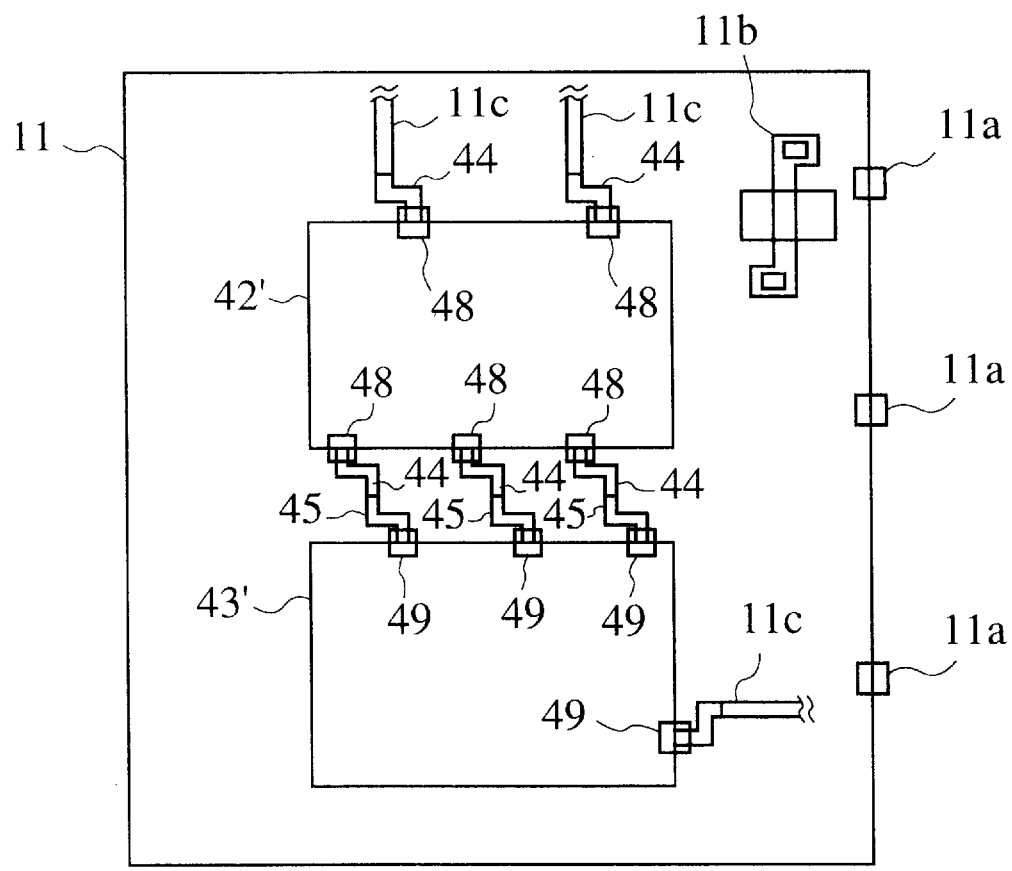
FIG. 27 shows terminals of the abstract cells moved according to the eighth embodiment.

FIG. 27 shows the target cell 11 after moving the terminals 42a and 43a. The terminals 42a have been moved to terminals 48, and the terminals 43a have been moved to terminals 49.

Step S16 compacts the layout of FIG. 27. Step S17 replaces the abstract cells with the compacted lower cells.

Figure 28A:
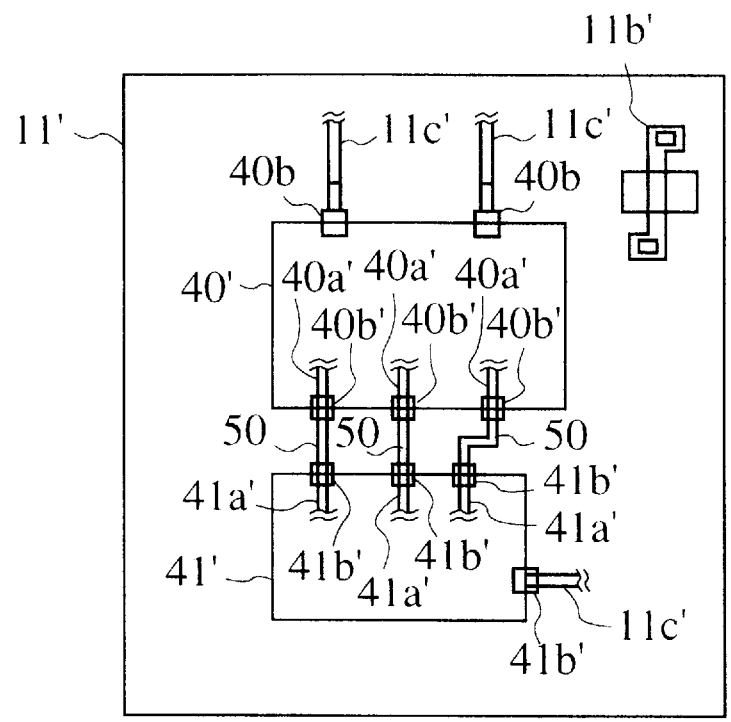
FIGS. 28A and 28B show a compacted target cell according to the eighth embodiment.
Figure 28B:
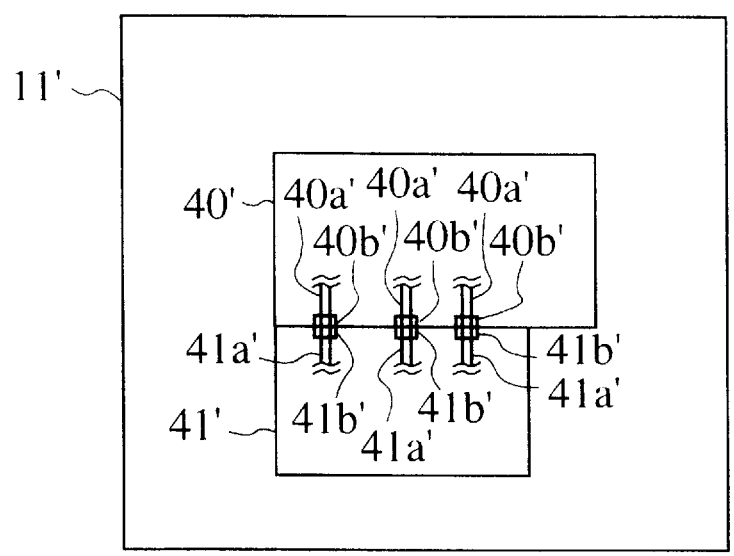

FIGS. 28A and 28B show results of the compaction. In FIG. 28A, the target cell 11 has been compacted into a cell 11' that includes compacted lower cells 40' and 41'. The compacted lower cells 40' and 41' have lines 40a' and 41a' and terminals 40b' and 41b'. The compacted target cell 11' has lines 50.

Although the abutted lower cells 40 and 41 have been separated from each other in FIG. 28A, the lines 50 correctly connect them to each other.

In FIG. 28B, the lower cells are still abutting on each other and are connected to each other through aligned terminals after compaction. Since there is no need of lines 50 (FIG. 28A), they are eliminated.

In this way, the eighth embodiment is capable of compacting a target cell having abutting lower cells.

The following ninth to eleventh embodiments resemble the first to eighth embodiments and employ a standardized virtual channel area process.

Ninth embodiment

Figure 30:
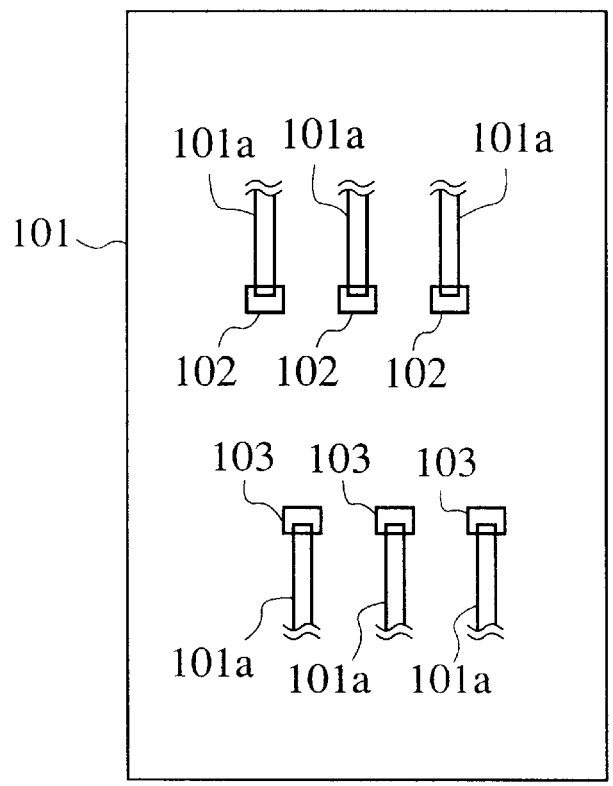
FIG. 30 shows a target cell according to the ninth embodiment.

FIG. 29 is a flowchart showing a method of generating a hierarchical layout of cells of a semiconductor integrated circuit according to the ninth embodiment, and FIG. 30 shows a target cell to be processed according to the ninth embodiment.

The target cell 101 has lines 101a and terminals 102 and 103. The terminals 102 are connected to the terminals 103.

Figure 31:
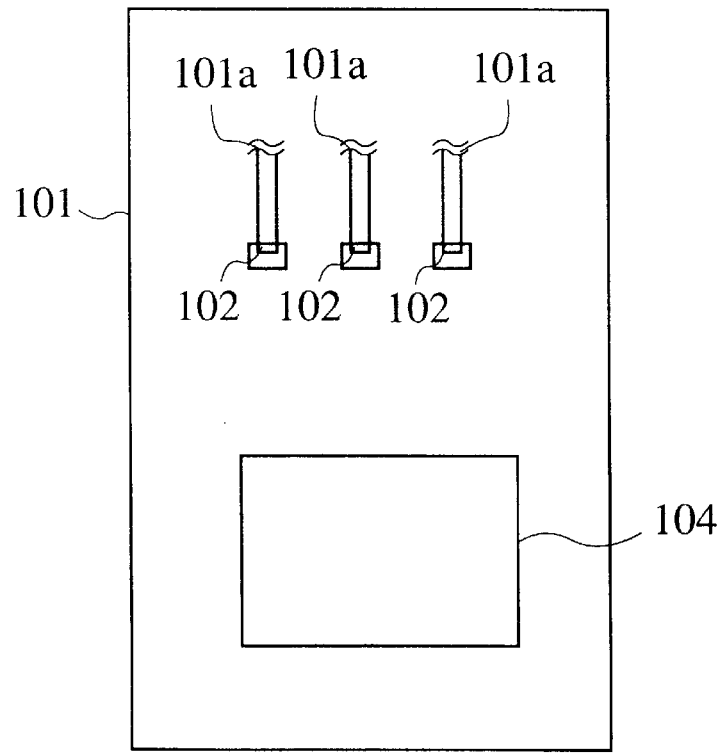
FIG. 31 shows an abstract cell according to the ninth embodiment.

Step S201 arranges an abstract cell 104 having an edge on which the terminals 103 are arranged. The abstract cell 104 replaces the terminals 103 and corresponding lines 101a as shown in FIG. 31.

Step S202 sets the following compaction constraints:

(1) keeping the size of the abstract cell 104 even after compaction; and (2) regulating the positions of the terminals 102 according to the relative positions of the terminals 103 on the abstract cell 104, or regulating the position of an end one of the terminals 102 according to the relative position of an end one of the terminals 103 on the abstract cell 104 and determining the positions of the other of the terminals 102 according to the end terminal 102.

Figure 32:
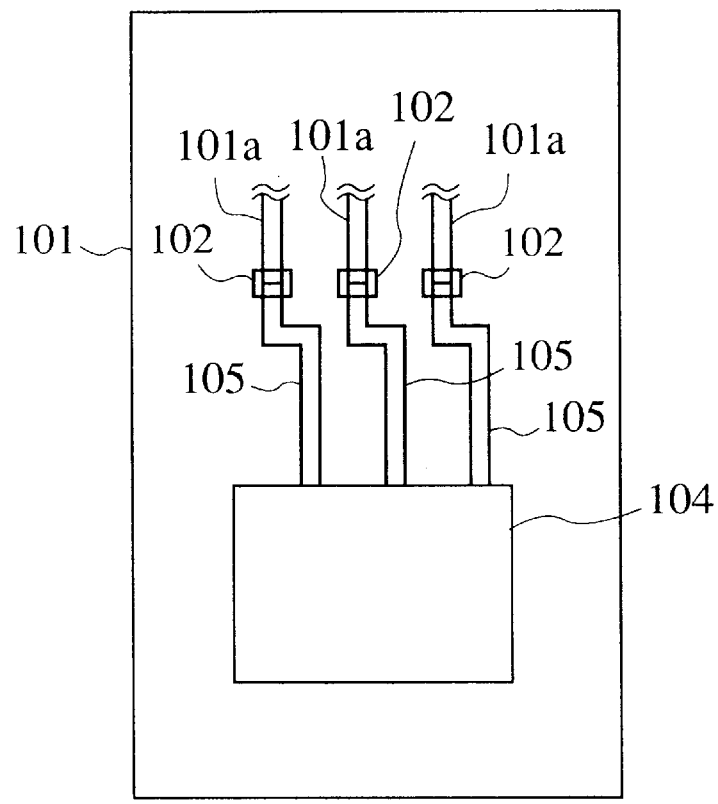
FIG. 32 shows jogged lines according to the ninth embodiment.

Step S203 extends jogged lines 105 from the terminals 102 to the abstract cell 104 as shown in FIG. 32.

Figure 33:
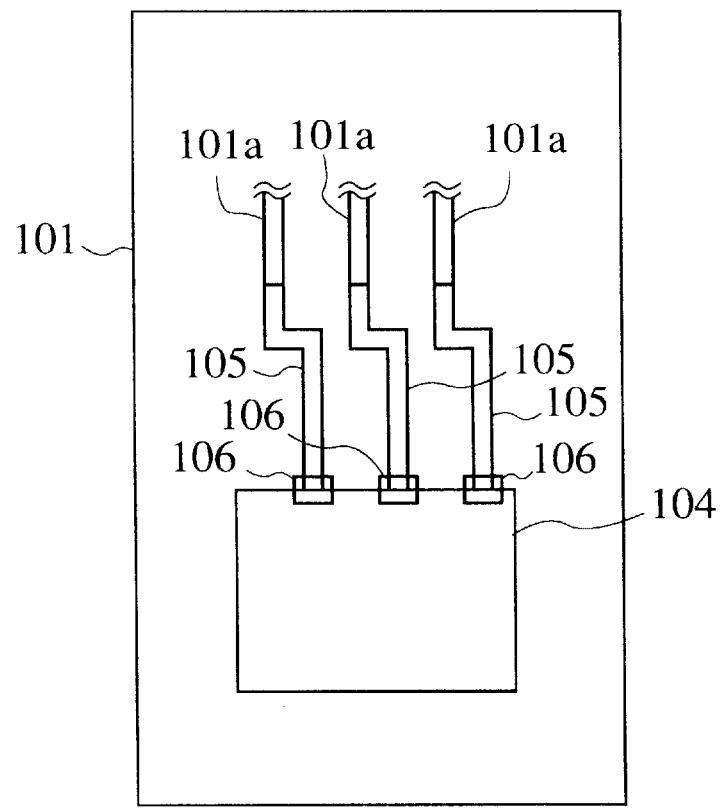
FIG. 33 shows terminals moved according to the ninth embodiment.

Step S204 moves the terminals 102 to intersections between the jogged lines 105 and the abstract cell 104, to form terminals 106 as shown in FIG. 33.

Step S205 compacts the layout of FIG. 33. Step S206 replaces the abstract cell 104 with the original part, to complete the process. The abstract cell 104 may represent a lower cell.

If there is any break after compaction according to the ninth embodiment, the break may be corrected by any one of the embodiments mentioned below or by one of the river routing, line search, maze routing, and channel routing techniques.

Step S201 may simply arrange an abstract cell on the target cell 101, and step S206 may be omitted.

Tenth embodiment

Figure 34:
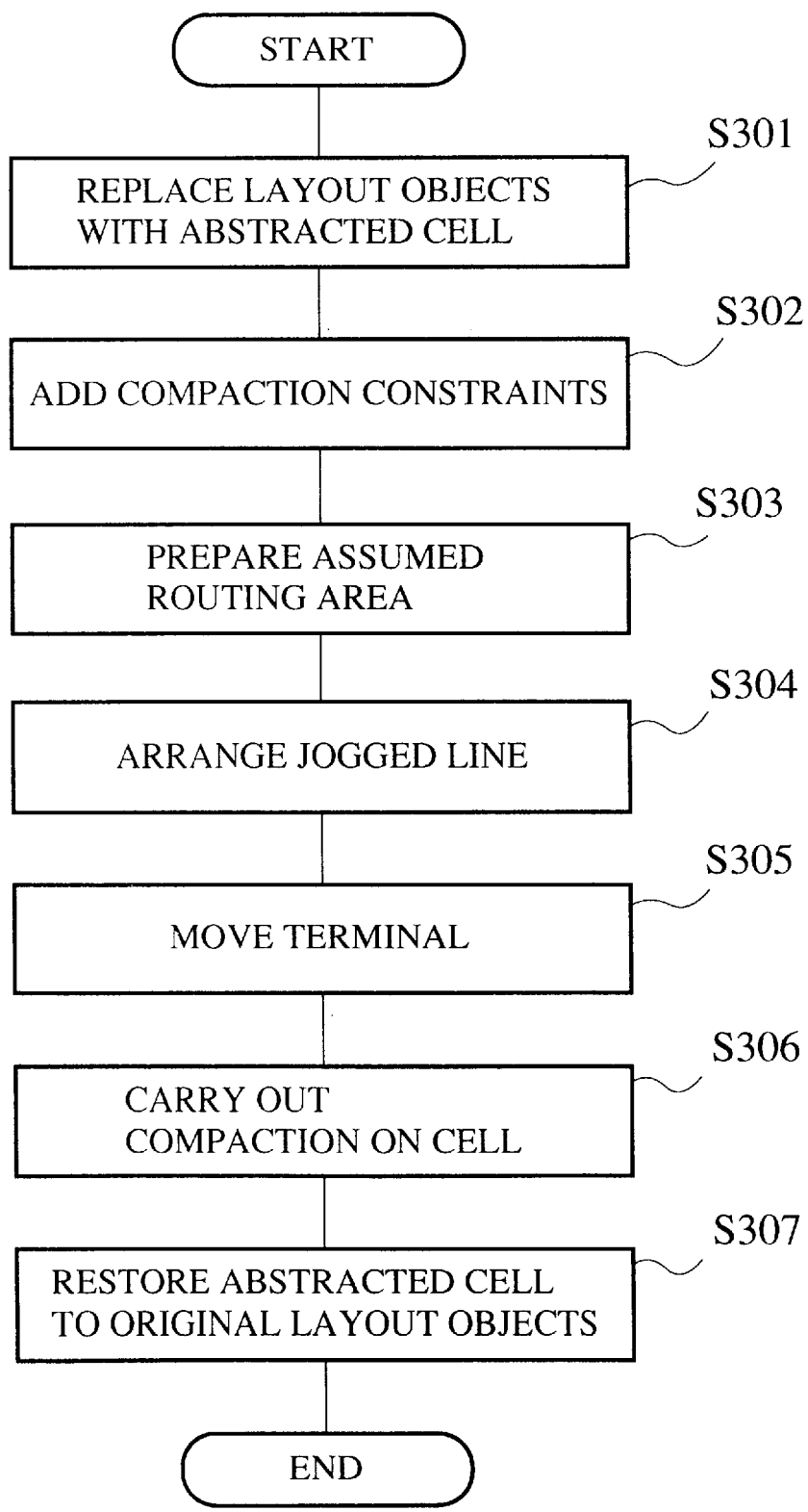
FIG. 34 is a flowchart showing a tenth embodiment of the present invention.

FIG. 34 is a flowchart showing a method of generating a hierarchical layout of cells of a semiconductor integrated circuit according to the tenth embodiment.

Figure 35:
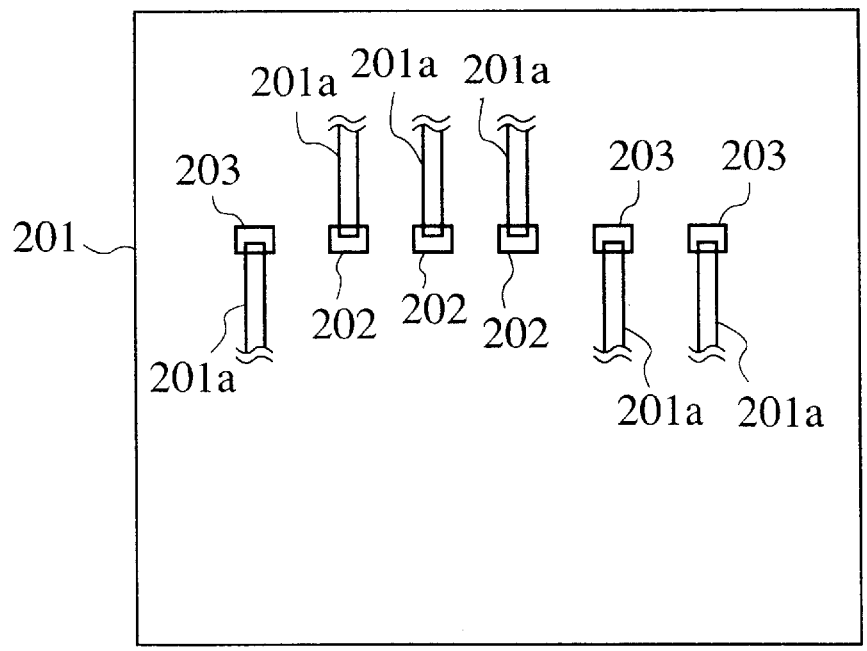
FIG. 35 shows a target cell according to the tenth embodiment.

In addition to the flow chart of FIG. 29, the flow chart of FIG. 34 has step S303 for preparing a virtual channel area. FIG. 35 shows a target cell 201 to be compacted. Unlike the target cell of FIG. 31, terminals of the target cell 201 are linearly arranged.

The target cell 201 has lines 201a having terminals 202 and 203. The terminals 202 are connected to the terminals 203.

Figure 36:
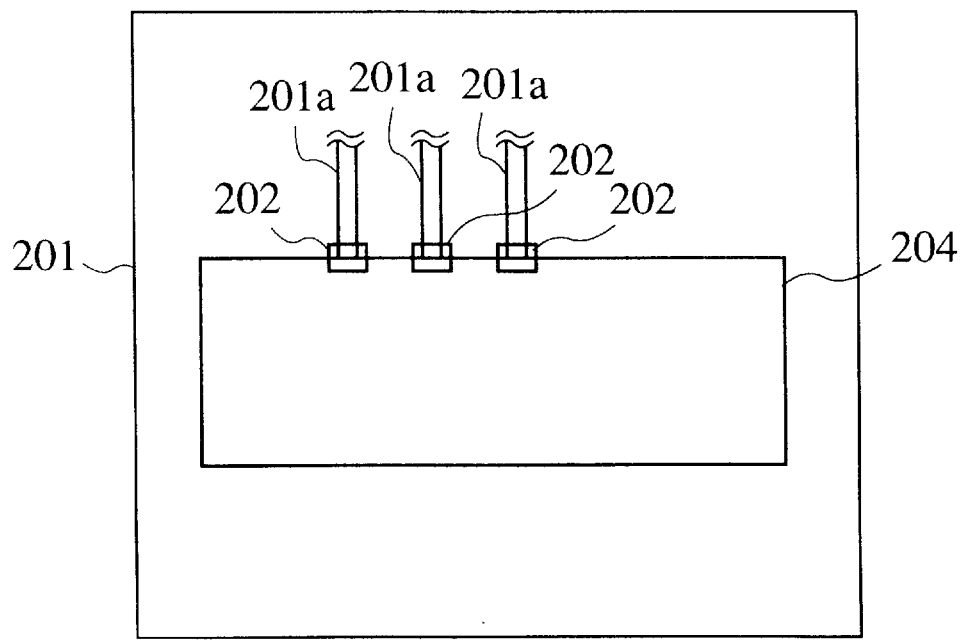
FIG. 36 shows an abstract cell according to the tenth embodiment.

Step S301 arranges an abstract cell 204 having an edge on which the terminals 203 are arranged. Namely, the abstract cell 204 replaces the terminals 203 and corresponding lines 201a as shown in FIG. 36.

Step S302 sets the following compaction constraints:

(1) keeping the size of the abstract cell 204 even after compaction; and (2) regulating the positions of the terminals 202 according to the relative positions of the terminals 203 on the abstract cell 204, or regulating the position of an end one of the terminals 202 according to the relative position of an end one of the terminals 203 on the abstract cell 204 and determining the positions of the other of the terminals 202 according to the end terminal 202.

Figure 37:
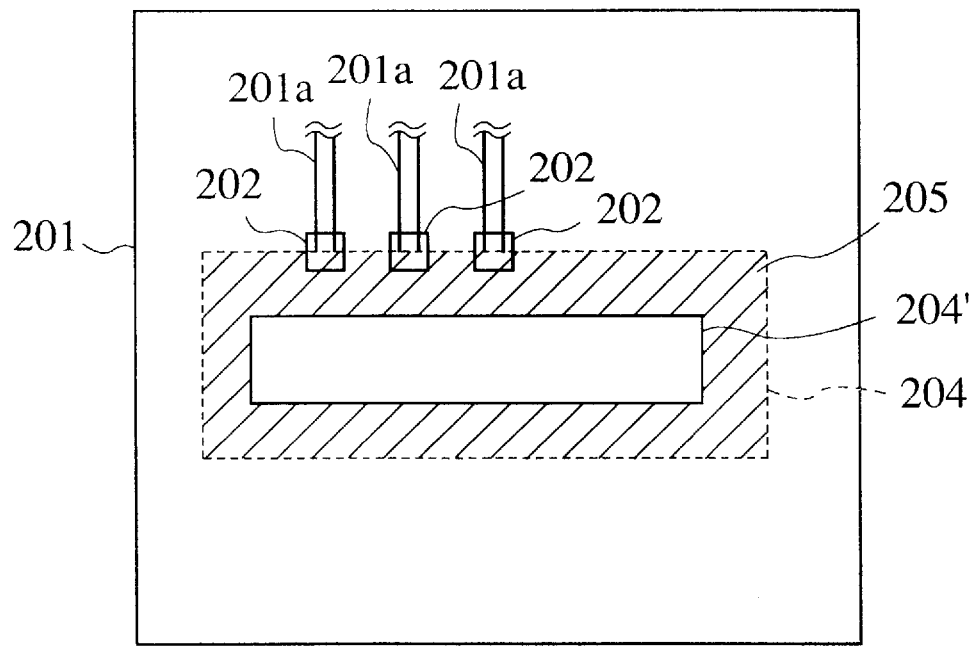
FIG. 37 shows a virtual channel area according to the tenth embodiment.

Step S303 reduces the abstract cell 204 into a reduced abstract cell 204' and forms a virtual channel area 205 as shown in FIG. 37.

Figure 38:
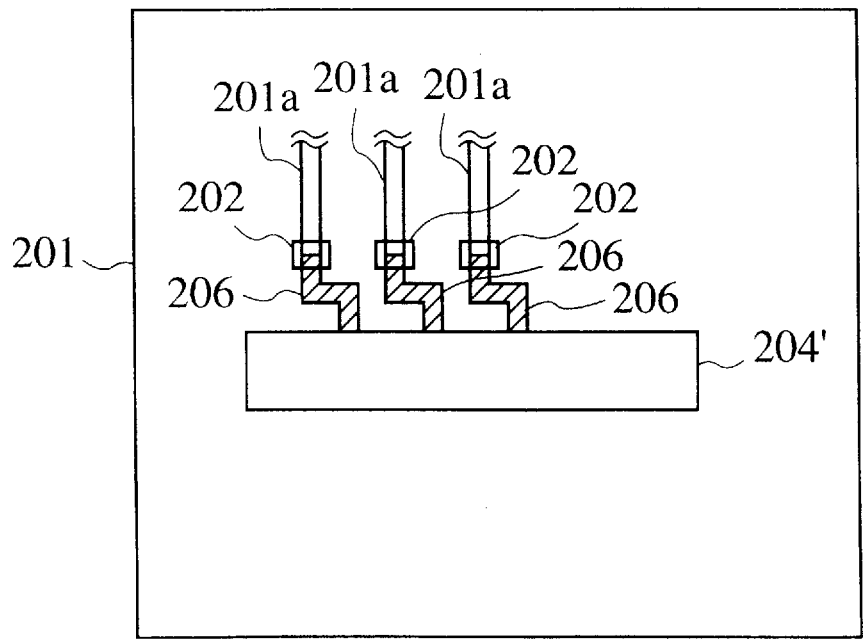
FIG. 38 shows jogged lines according to the tenth embodiment.

Step S304 extends jogged lines 206 from the terminals 202 to the abstract cell 204' through the virtual channel area 205 as shown in FIG. 38.

Figure 39:
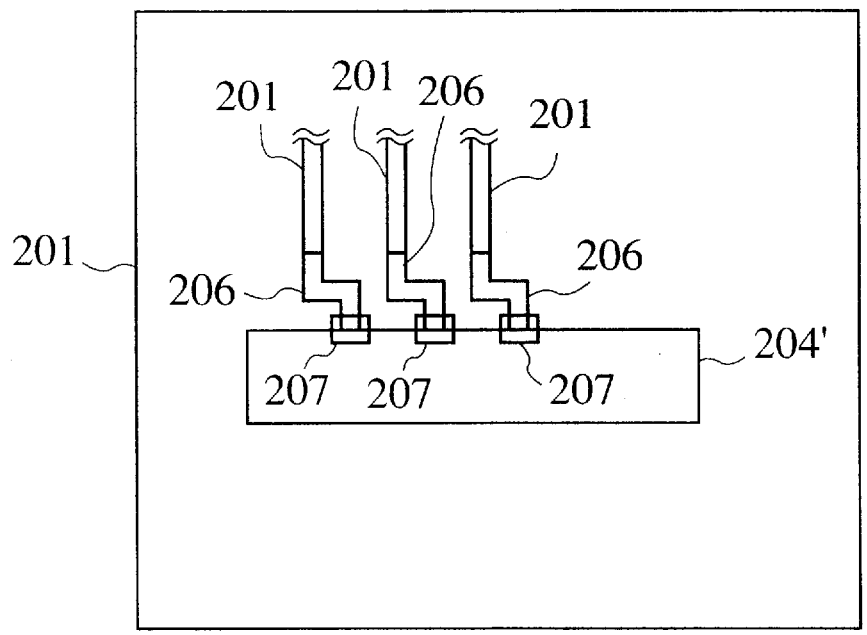
FIG. 39 shows terminals moved according to the tenth embodiment.

Step S305 moves the terminals 202 to intersections between the jogged lines 206 and the abstract cell 204', to form terminals 207 as shown in FIG. 39.

Step S306 compacts the layout of FIG. 39. Step S307 replaces the abstract cell 204' with the original part, to complete the process. The abstract cell 204 may represent a lower cell.

Figure 40:
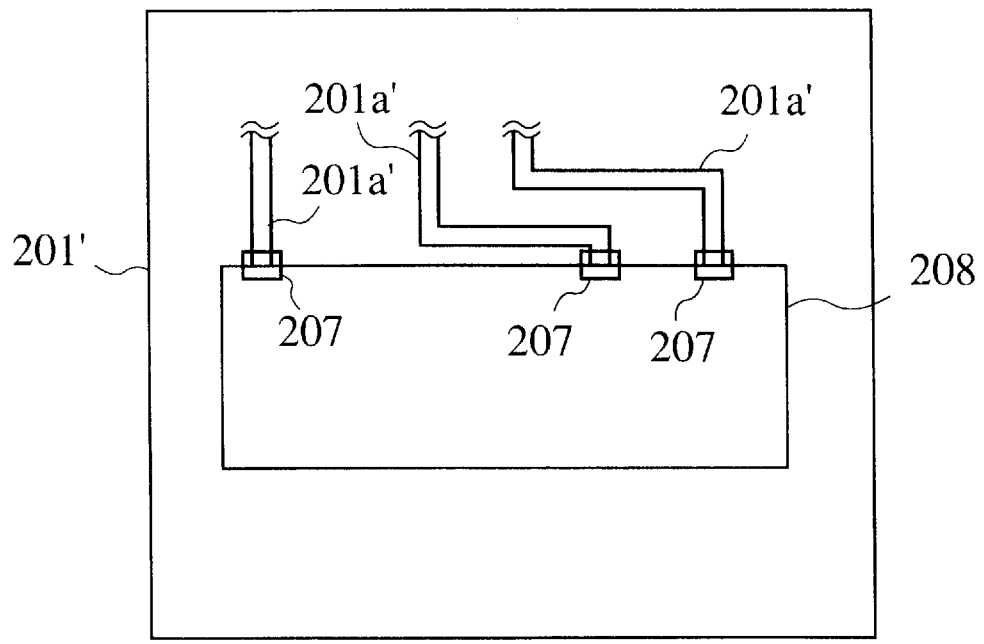
FIG. 40 shows a compacted target cell according to the tenth embodiment.

FIG. 40 shows an example of a compacted target cell 201' having lines 201a' according to the tenth embodiment. Every terminal is successfully connected.

Although unnecessary jogged lines are deleted to save space by compactor, the jogged lines of FIG. 40 are effective to connect the lines 201a' to an abstract cell 208.

If there is any break after compaction according to the tenth embodiment, the break may be corrected by the embodiment mentioned below or by one of the river routing, line search, maze routing, and channel routing techniques.

Eleventh embodiment

Figure 41:
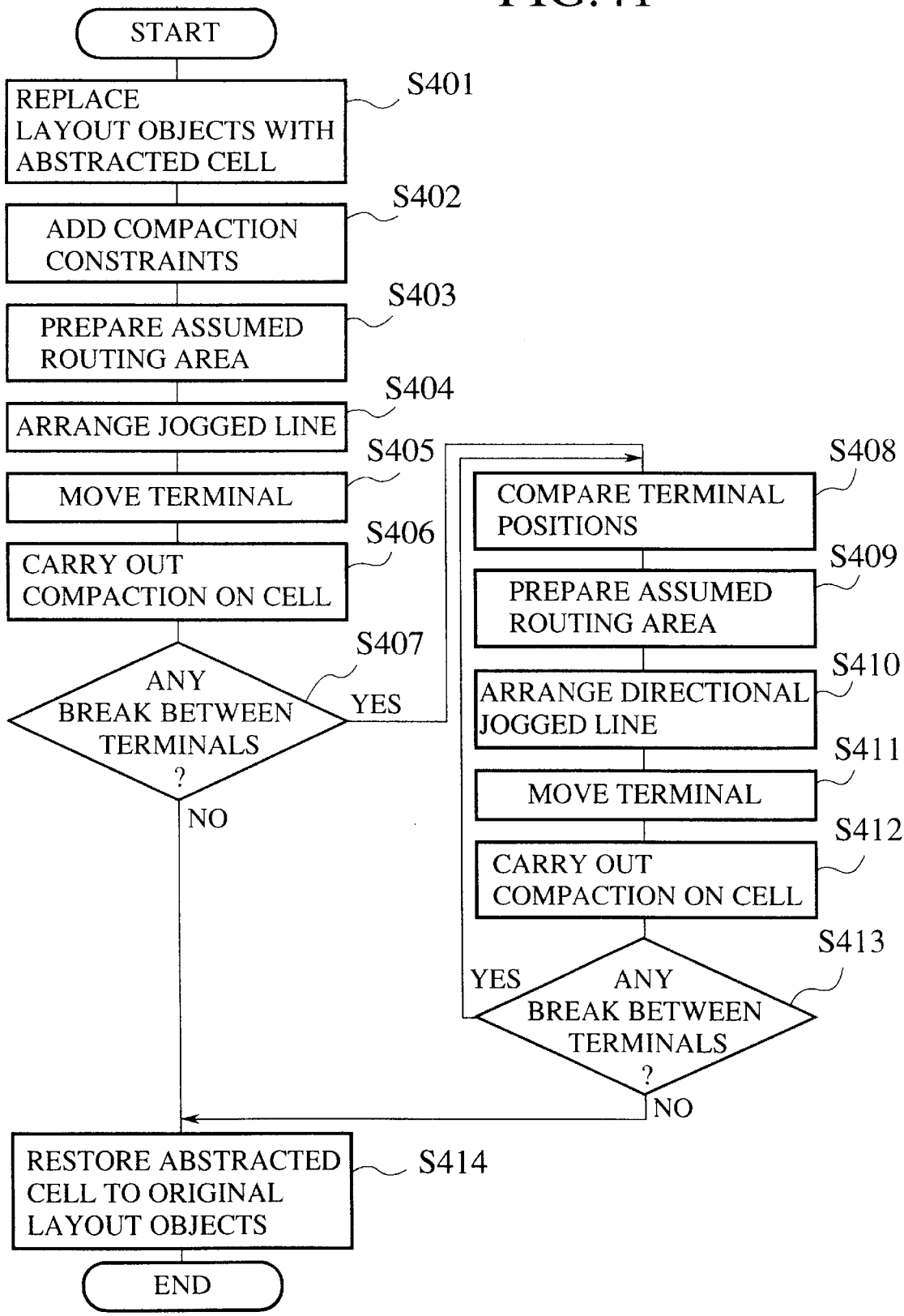
FIG. 41 is a flowchart showing an eleventh embodiment of the present invention.

FIG. 41 is a flowchart showing a method of generating a hierarchical layout of cells of a semiconductor integrated circuit according to the eleventh embodiment.

In addition to the flowchart of FIG. 34, the flowchart of FIG. 41 has steps S407 to S413. Steps S401 to S406 of FIG. 41 correspond to steps S301 to S306 of FIG. 34, and step S414 corresponds to step S307.

Figure 42:
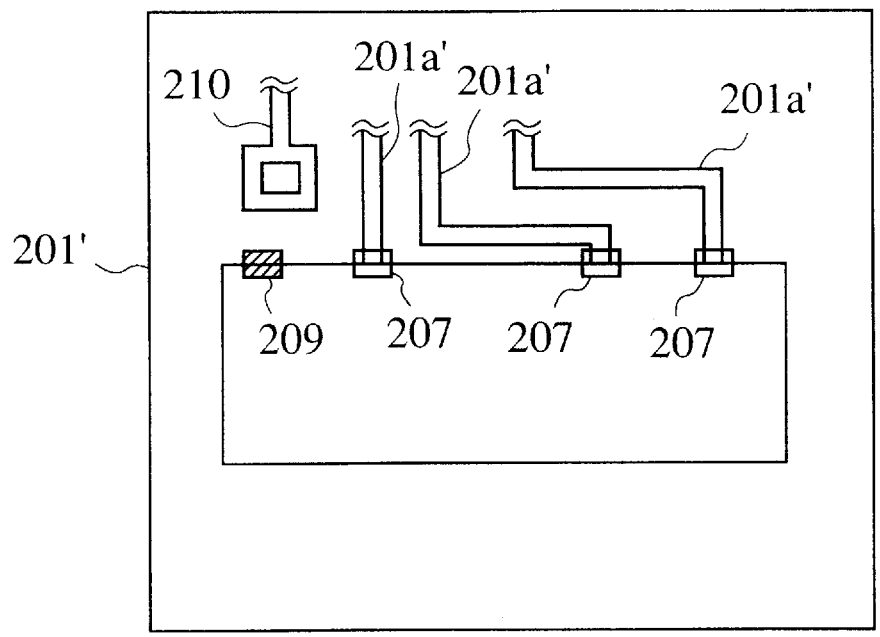
FIG. 42 shows a compacted target cell according to the eleventh embodiment.

FIG. 42 shows an example of a result of compaction according to the tenth embodiment with a connection failed terminal. A compacted target cell 201' has a circuit pattern 210 that has caused the break with respect to a terminal 209.

This state may occur after steps S401 to S406 of FIG. 41. Step S407 detects the break, and step S408 is carried out. If there is no break, step S414 will be carried out.

Steps S408 to S410 are the same as steps S108 to S110 of the third embodiment of FIG. 13.

Namely, the terminal 209 of FIG. 42 corresponds to the terminal 24 of FIGS. 15 and 16A to 16D.

Figure 43:
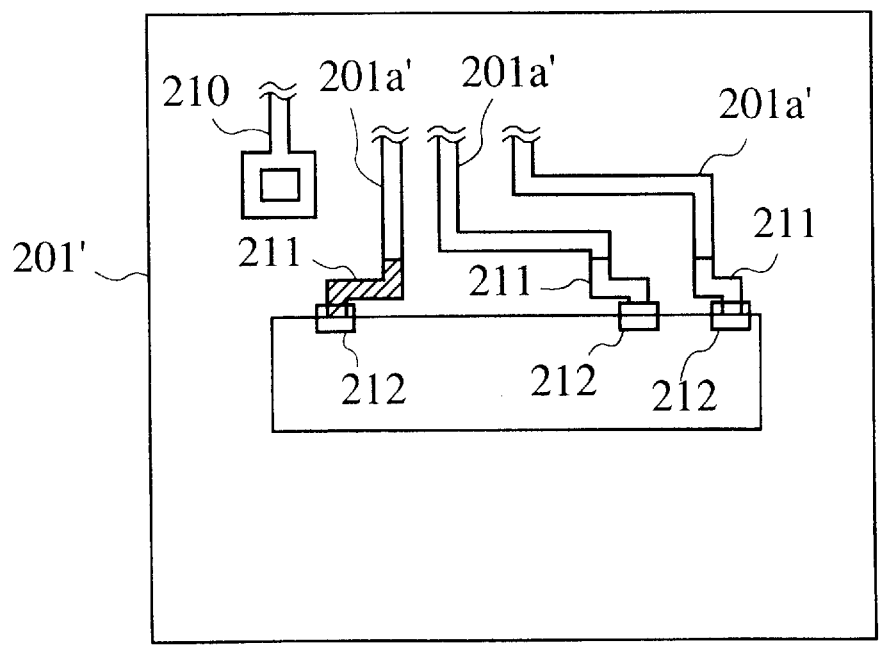
FIG. 43 shows jogged lines according to the eleventh embodiment.

Step S410 arranges directional jogged lines 211 similar to the third embodiment, and step S411 moves original terminals to form terminals 212 as shown in FIG. 43.

Step S412 compacts the target cell. Step S413 determines whether or not there is a break between terminals. If there is no break, step S414 is carried out. If there is a break, steps S408 to S413 are repeated. As a result, the number of breaks will be zeroed.

As explained above in detail, the present invention generates and compacts a hierarchical layout of cells of a semiconductor integrated circuit without routing algorithms.

The present invention greatly reduces breaks among terminals of the hierarchical cells with the use of a virtual channel area even if there is no wiring area.

The present invention even zeroes breaks among the terminals of the hierarchical cells.

The present invention may employ the bottom-up method to compact the hierarchical layout as it is without breaks or rewiring. Unlike the pitch matching method, the present invention has a wide range of applications because it is applicable to integrated circuits having irregular hierarchies of cells.

The present invention is capable of greatly reducing, even zeroing breaks among hierarchical levels of a given integrated circuit.

The present invention may limit the movements of terminals of a given cell, to make connections among hierarchical levels of a given integrated circuit easier.

The present invention is capable of connecting lines of a target cell to a lower cell without unnecessarily moving terminals even if the lines run along the lower cell.

In this way, the present invention provides a hierarchical compaction system that solves the problems of the conventional bottom-up and pitch matching methods and is practical in terms of processing time and easiness of use.

While the above provides a full and complete disclosure of the preferred embodiments of the present invention, various modifications, alternate constructions, and equivalents may be employed without departing from the true spirit and scope of the invention. Therefore, the above description and illustration should not be construed as limiting the scope of the invention, which is defined by the appended claims.

What is claimed is:

1. A method of generating a layout of cells of a semiconductor integrated circuit, comprising the steps of:

selecting, among a plurality of terminals which have not been connected, a first terminal as one end of a wiring for connection and a second terminal to be connected to said first terminal through said wiring;

arranging an abstract cell in a position of a plurality of layout objects connected to said second terminal in order that said second terminal is located at an edge of said abstract cell, said layout objects being included by said abstract cell;

removing said layout objects and said second terminal;

reducing the size of said abstract cell to form a virtual channel area;

setting the positions of said second terminals on the abstract cell as compaction constraints on the first terminals;

extending said wiring with a jogged line from the first terminals to reach the edge of the abstract cell through said virtual channel area;

moving the first terminals having the compaction constraints to intersections between the jogged line and the edge of the abstract cell;

compacting said layout; and replacing said abstract cell with the plurality of said layout objects.

2. The method of claim 1, wherein, if there are breaks between the first and second terminals after compacting the target cell, the breaks are zeroed by repeating the steps of:

comparing the positions of each pair of the first and second terminals on the edge of the abstract cell, to determine a direction from the first terminal to the second terminal;

reducing the size of the abstract cell, to form a virtual channel area;

setting the positions of the second terminals on the abstract cell as compaction constraints on the first terminals and setting a compact size as a compaction constraint on the abstract cell;

extending jogged lines from the first terminals toward the second terminals through the virtual channel area according to the determined directions;

moving the first terminals having the compaction constraints to intersections between the jogged lines and the edge of the abstract cell; and compacting the target cell.

3. A method of generating a layout of cells of a semiconductor integrated circuit, comprising the steps of:

selecting, among a plurality of terminals which have not been connected, a first terminal as one end of a wiring for connection and a second terminal to be connected to said first terminal through said wiring;

arranging an abstract cell in a position of a plurality of layout objects including said second terminal in order that said second terminal is located at an edge of said abstract cell;

setting the positions of said second terminals on the abstract cell as compaction constraints on the first terminals;

extending said wiring with a jogged line from the first terminals to reach the edge of the abstract cell;

moving the first terminals having the compaction constraints to intersections between the jogged line and the edge of the abstract cell;

compacting said layout; and repeating the above steps.

4. A storage medium storing an electrically readable program that generates a layout of cells of a semiconductor integrated circuit through the steps of:

selecting, among the cells, a target cell having a lower cell and replacing the lower cell with an abstract cell whose periphery is identical to that of an uncompacted form of the lower cell and which has terminals whose positions agree with those of the uncompacted form of the lower cell;

reducing the size of the abstract cell, to form a virtual channel area after the lower cell is replaced with the abstract cell;

setting the positions of the terminals on the lower cell after compaction as compaction constraints on the terminals of the abstract cell, to properly connect the target and lower cells to each other, and setting a compact size of the lower cell as a compaction constraint on the abstract cell;

extending jogged lines from the terminals of the abstract cell up to an edge of the reduced abstract cell through the virtual channel area after the compaction constraints have been set;

moving the terminals of the abstract cell having the compaction constraints to intersections between the jogged lines and the edge of the reduced abstract cell; and compacting the target cell.

5. The method of claim 4, further comprising the step of repeating the steps recited in claim 4 from the lowest hierarchical level to the highest hierarchical level.

6. A method of generating a hierarchical layout of cells of a semiconductor integrated circuit from a lowest cell up to a highest cell, comprising the steps of:

selecting, among the cells, a target cell having a lower cell and replacing the lower cell with an abstract cell whose periphery is identical to that of an uncompacted form of the lower cell and which has terminals whose positions agree with those of the uncompacted form of the lower cell;

reducing the size of the abstract cell, to form a virtual channel area after the lower cell is replaced with the abstract cell;

setting the positions of the terminals on the lower cell after compaction as compaction constraints on the terminals of the abstract cell, to properly connect the target and lower cells to each other, and setting a compact size of the lower cell as a compaction constraint on the abstract cell;

extending jogged lines from the terminals of the abstract cell up to an edge of the reduced abstract cell through the virtual channel area after the compaction constraints have been set;

moving the terminals of the abstract cell having the compaction constraints to intersections between the jogged lines and the edge of the reduced abstract cell;

compacting the target cell; and replacing the abstract cell with the lower cell of the compact size.

7. The method of claim 6, further comprising the step of repeating the steps recited in claim 6 from the lowest hierarchical level to the highest hierarchical level.

8. The method of claim 6, wherein, if there are breaks between the target and lower cells after compacting the target cell, the breaks are zeroed by repeating the steps of:

comparing the positions of each pair of the terminals of the abstract and lower cells on the edge of the abstract cell, to determine a direction from the terminal of the abstract cell to the terminal of the lower cell;

reducing the size of the abstract cell, to form a virtual channel area;

setting the positions of the terminals of the lower cell as compaction constraints on the terminals of the abstract cell, to connect the target and lower cells to each other and setting a compact size of the lower cell as a compaction constraint on the abstract cell;

extending jogged lines from the terminals of the abstract cell toward the edge of the reduced abstract cell through the virtual channel area according to the determined directions;

moving the terminals of the abstract cell having the compaction constraints to intersections between the jogged lines and the edge of the reduced abstract cell; and compacting the target cell.

9. The method of claim 6, wherein lines of the target cell are constrained so that they are connected to the terminals of the abstract cell, and the terminals of the target cell are constrained to be movable within a given range.

10. The method of claim 6, wherein the positions of the terminals of the abstract cell are determined according to the shapes of lines of the target and lower cells to be connected to each other.

11. A storage medium storing an electrically readable program that generates a layout of cells of a semiconductor integrated circuit through the steps of:

selecting, among a plurality of terminals which have not been connected, a first terminal as one end of a wiring for connection and a second terminal to be connected to said first terminal through said wiring;

arranging an abstract cell in a position of a plurality of layout objects connected to said second terminal in order that said second terminal is located at an edge of said abstract cell, said layout objects being included by said abstract cell;

removing said layout objects and said second terminal;

reducing the size of said abstract cell to form a virtual channel area;

setting the positions of said second terminals on the abstract cell as compaction constraints on the first terminals;

extending said wiring with a jogged line from the first terminals to reach the edge of the abstract cell through said virtual channel area;

moving the first terminals having the compaction constraints to intersections between the jogged line and the edge of the abstract cell;

compacting said layout; and replacing said abstract cell with the plurality of said layout objects.

12. A storage medium storing an electrically readable program that generates a layout of cells of a semiconductor integrated circuit through the steps of:

selecting, among a plurality of terminals which have not been connected, a first terminal as one end of a wiring for connection and a second terminal to be connected to said first terminal through said wiring;

arranging an abstract cell in a position of a plurality of layout objects connected to said second terminal in order that said second terminal is located at an edge of said abstract cell, said layout objects being included by said abstract cell;

setting the positions of said second terminals on the abstract cell as compaction constraints on the first terminals;

extending said wiring with a jogged line from the first terminals to reach the edge of the abstract cell;

moving the first terminals having the compaction constraints to intersections between the jogged line and the edge of the abstract cell; and compacting said layout.

* * * * *